(12) United States Patent
Wilson

(10) Patent No.: US 12,374,698 B1
(45) Date of Patent: Jul. 29, 2025

(54) IONOMER COMPONENTS COMPRISING SELECTIVELY DEPOSITED CATALYSTS AND METHODS OF MAKING AND USING THE SAME

(71) Applicant: Triad National Security, LLC, Los Alamos, NM (US)

(72) Inventor: Mahlon S. Wilson, Los Alamos, NM (US)

(73) Assignee: Triad National Security, LLC, Los Alamos, NM (US)

( * ) Notice: Subject to any disclaimer, the term of this patent is extended or adjusted under 35 U.S.C. 154(b) by 362 days.

(21) Appl. No.: 17/873,687

(22) Filed: Jul. 26, 2022

Related U.S. Application Data

(62) Division of application No. 15/959,003, filed on Apr. 20, 2018, now abandoned.

(60) Provisional application No. 62/488,626, filed on Apr. 21, 2017.

(51) Int. Cl.
| | |
|---|---|
| *H01M 4/96* | (2006.01) |
| *C23C 14/18* | (2006.01) |
| *C23C 14/24* | (2006.01) |
| *H01M 4/62* | (2006.01) |
| *H01M 4/86* | (2006.01) |
| *H01M 4/88* | (2006.01) |
| *H01M 4/92* | (2006.01) |

(Continued)

(52) U.S. Cl.
CPC ........... *H01M 4/8892* (2013.01); *C23C 14/18* (2013.01); *C23C 14/24* (2013.01); *H01M 4/623* (2013.01); *H01M 4/8626* (2013.01); *H01M 4/8867* (2013.01); *H01M 4/925* (2013.01); *H01M 4/96* (2013.01); *H01M 8/1004* (2013.01); *H01M 2004/027* (2013.01); *H01M 2004/028* (2013.01)

(58) Field of Classification Search
CPC .. H01M 4/623; H01M 4/8626; H01M 4/8892; H01M 4/8867; H01M 4/925; H01M 4/96; H01M 8/1004; H01M 2004/027; H01M 2004/028
See application file for complete search history.

(56) References Cited

U.S. PATENT DOCUMENTS

| | | |
|---|---|---|
| 4,876,115 A | 10/1989 | Raistrick |
| 5,211,984 A | 5/1993 | Wilson |
| 5,879,827 A | 3/1999 | Debe et al. |

(Continued)

FOREIGN PATENT DOCUMENTS

| | | |
|---|---|---|
| CN | 104701549 | 6/2015 |

OTHER PUBLICATIONS

Saha et al. Electrochimica Acta 51 (2006) 4680-4692 (Year: 2006).*

(Continued)

*Primary Examiner* — Victoria H Lynch
(74) *Attorney, Agent, or Firm* — Klarquist Sparkman, LLP

(57) ABSTRACT

Embodiments of ionomer components comprising selectively deposited catalysts are described. The ionomer component comprise a catalyst that is preferentially deposited on or in the vicinity of the ionomer component over other areas of electrochemical components that do not comprise the ionomer component. Also disclosed herein are novel methods and apparatus embodiments used to make the disclosed ionomer components and devices comprising the same.

7 Claims, 15 Drawing Sheets
(4 of 15 Drawing Sheet(s) Filed in Color)

(51) Int. Cl.
*H01M 8/1004* (2016.01)
*H01M 4/02* (2006.01)

(56) References Cited

U.S. PATENT DOCUMENTS

| | | | |
|---|---|---|---|
| 8,383,291 B2 | 2/2013 | Xie | |
| 2006/0141314 A1* | 6/2006 | Kim | H01M 8/103 |
| | | | 429/513 |
| 2007/0054798 A1* | 3/2007 | Ruud | C25B 11/00 |
| | | | 429/495 |
| 2010/0240527 A1* | 9/2010 | Yoshizawa | H01M 4/8867 |
| | | | 502/101 |
| 2011/0287334 A1 | 11/2011 | Tanaka | |
| 2012/0156591 A1* | 6/2012 | Cha | H01M 4/926 |
| | | | 429/535 |
| 2014/0295314 A1* | 10/2014 | Lu | H01M 8/04291 |
| | | | 429/480 |

OTHER PUBLICATIONS

Debe, "Electrocatalyst approaches and challenges for automotive fuel cells," *Nature,* vol. 46, pp. 43-51, Jun. 7, 2012.
Babu et al., "Vertically Oriented Polymer Electrolyte Nanofiber Catalyst Support for Thin Film Proton-Exchange Membrane Fuel Cell Electrodes," *ChemElectroChem,* vol. 2, pp. 1752-1759, 2015.
Galbiati et al., "Supportless Platinum Nanotubes Array by Atomic Layer Deposition as PEM Fuel Cell Electrode", *Electrochimica Acta,* vol. 125, Jan. 27, 2014, p. 107-116.

\* cited by examiner

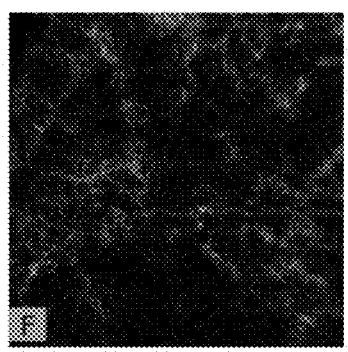 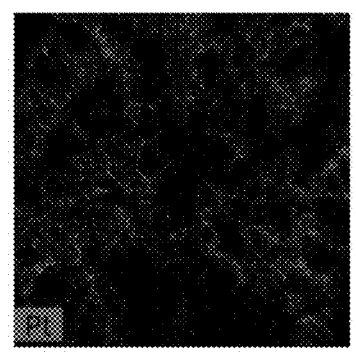
FIG. 4A　　　　　　　　　　FIG. 4B
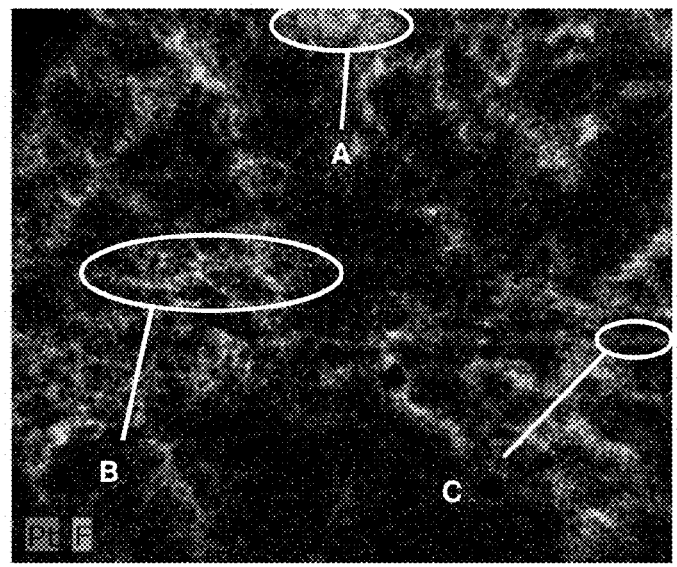
FIG. 4C
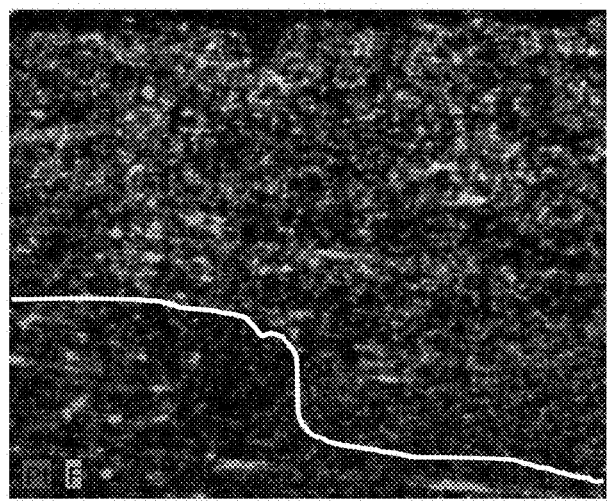
FIG. 5

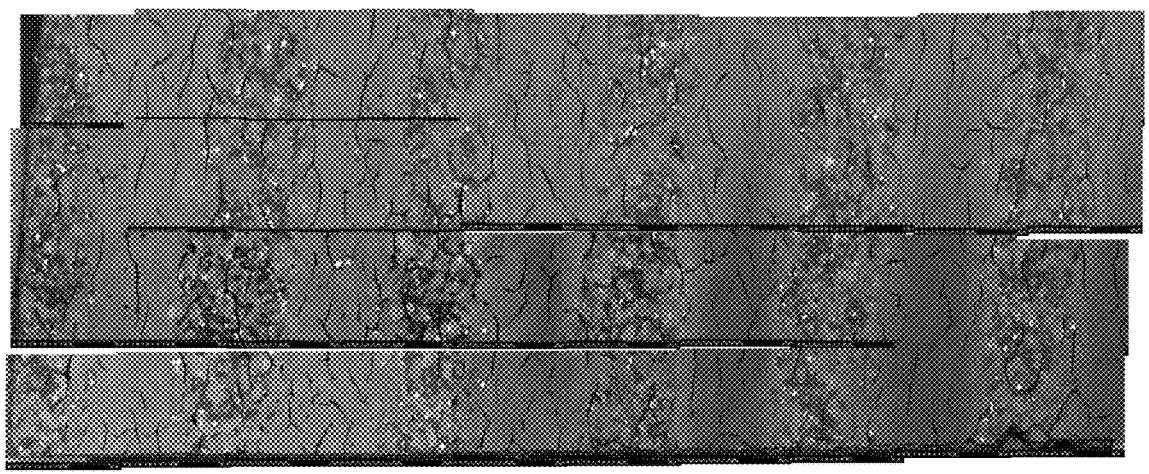
FIG. 7
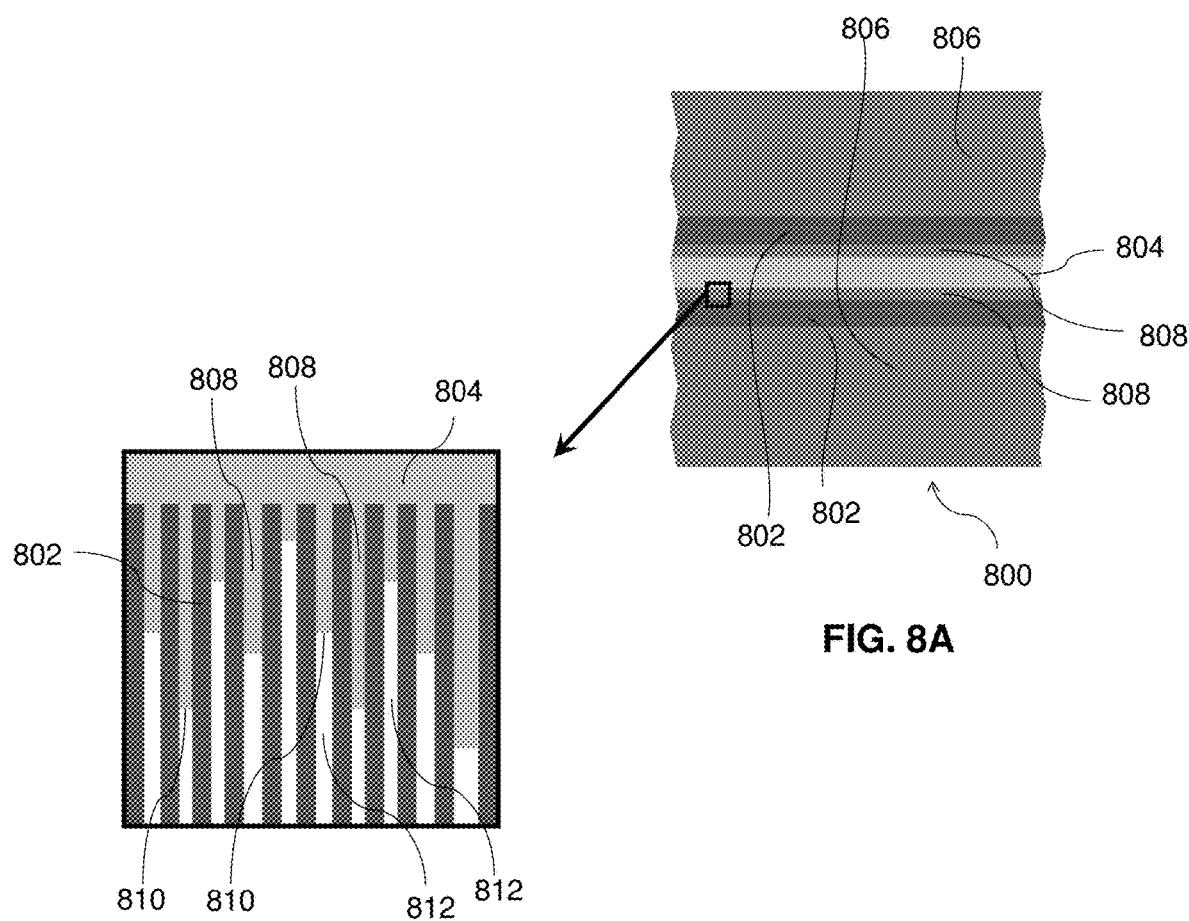
FIG. 8A
FIG. 8B

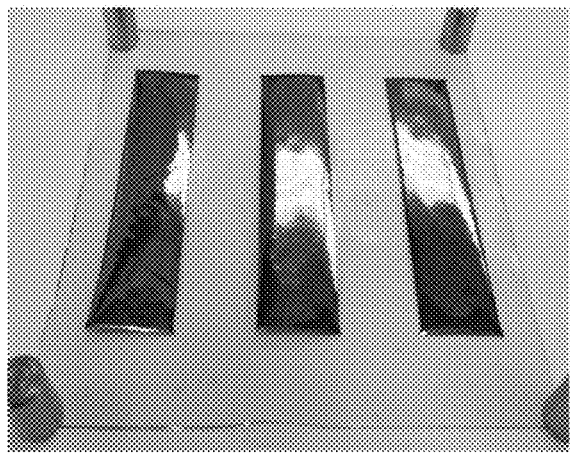 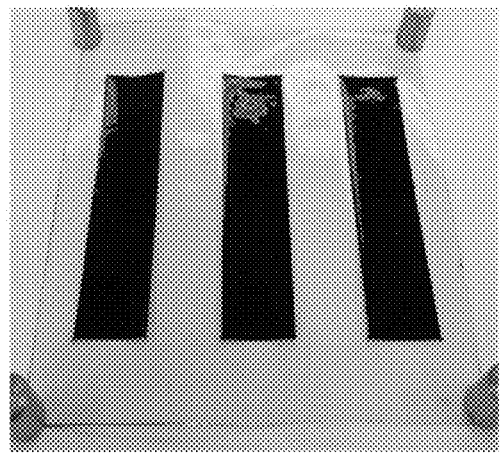
FIG. 9A　　　　　　　　　　FIG. 9B
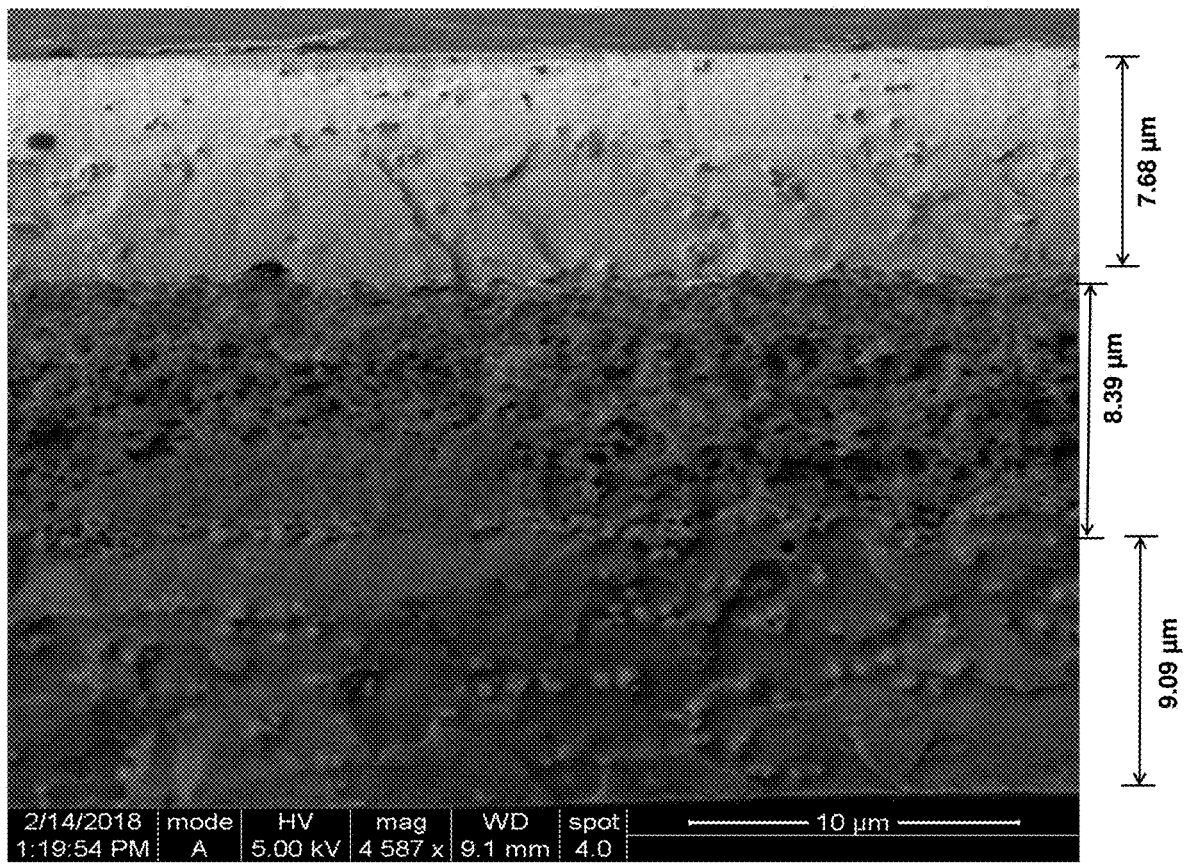
FIG. 10

FIG. 17A  FIG. 17B

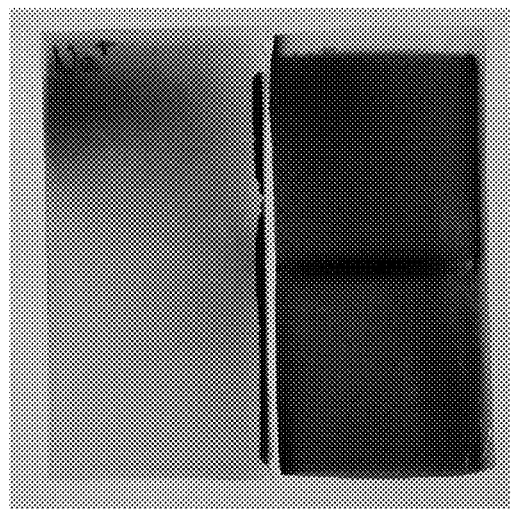
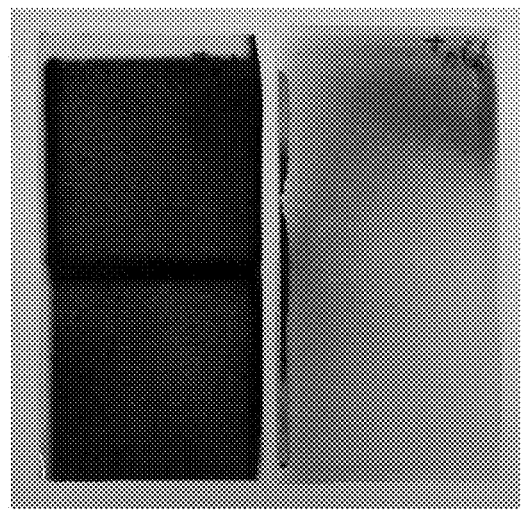
FIG. 19A          FIG. 19B
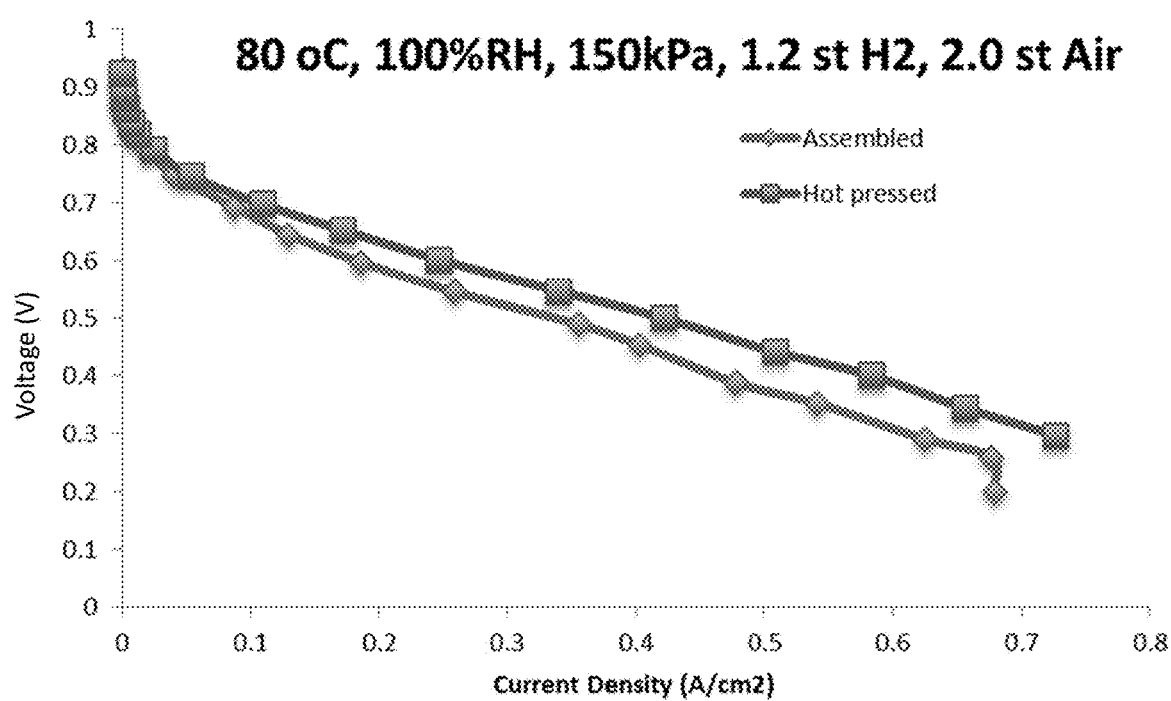
FIG. 20

IONOMER COMPONENTS COMPRISING SELECTIVELY DEPOSITED CATALYSTS AND METHODS OF MAKING AND USING THE SAME

CROSS REFERENCE TO RELATED APPLICATION

This application is a divisional of U.S. application Ser. No. 15/959,003, filed on Apr. 20, 2018, which claims the benefit of U.S. Provisional Application No. 62/488,626, filed on Apr. 21, 2017; the entirety of each of these prior applications is incorporated herein by reference.

ACKNOWLEDGMENT OF GOVERNMENT SUPPORT

This invention was made with government support under Contract No. 89233218CNA000001 awarded by the U.S. Department of Energy/National Nuclear Security Administration. The government has certain rights in the invention.

FIELD

Disclosed herein are embodiments of electrochemical components and structural components comprising selectively deposited catalysts and methods of making and using the same.

BACKGROUND

Electrochemical devices, such as polymer electrolyte fuel cells, can provide alternatives to internal combustion engines. Polymer electrolyte membrane (PEM) fuel cells are of particular interest in the transportation industry and also can be used in back-up and portable power applications. PEM fuel cells offer many advantages over liquid electrolyte fuel cells, including greater ultimate power densities, lower operating temperatures, and longer operating lifetimes. PEM materials are also generally resistant to corrosion and easy to incorporate into fuel cell structures. However, the anode and cathode half-cell reactions, $H_2$ and $O_2$ reactions, respectively, require catalysts to proceed at useful rates. While the two most common PEM fuel cell electrode technologies currently used, ionomer impregnated gas diffusion electrodes (GDEs) and catalyst coated membranes (CCMs), substantially decrease catalyst requirements from the original 4 mg $Pt/cm^2$ technologies, much of the catalyst within the electrodes of these two approaches are still not effectively utilized because of the difficulties of obtaining direct ionic and reactant access to all of the carbon supported catalyst. Thus, a need exists in the art for efficient catalyst deposition in electrode formation and other electrochemical component formation that not only improves performance of the fuel cell in which the electrode or electrochemical component is used, but also that reduces the costs associated with fabrication and device usage.

SUMMARY

Disclosed herein are embodiments of products, comprising an ionomer component and a selectively deposited catalyst. In some embodiments, the product comprises a diffusion component comprising (i) a microporous layer that comprises a conductive material, a treatment material, or a combination thereof and that has a membrane-facing surface, a base layer-facing surface, and a catalyst region; and (ii) a base layer comprising a microporous layer-facing surface and a gas reactant-facing surface. The microporous layer is deposited on the base layer such that the base layer-facing surface of the microporous layer faces the microporous layer-facing surface of the base layer. A catalyst material is deposited in the catalyst region of the microporous layer, the catalyst material comprising an ionomer component and a catalyst. The ionomer component is deposited in the catalyst region of the microporous layer and the catalyst is selectively deposited on or proximal to the ionomer component within the catalyst region of the microporous layer and is not deposited in an area outside of the catalyst region of the microporous layer or on the base layer.

In yet additional embodiments, products are disclosed that comprise an ionomer component comprising a selectively deposited catalyst and a structural component upon which the ionomer component is deposited. The selectively deposited catalyst does not physically contact or is not located in areas of the structural component that do not also physically contact the ionomer.

Also described herein are embodiments of methods for making electrochemical device components. One embodiment comprises dispensing an ionomer solution onto one surface of a structural component to form an ionomer-modified structural component; exposing the ionomer-modified structural component to a catalyst precursor in a chemical deposition chamber comprising an internal chamber surface that comprises a low surface energy material and/or a surface modifier, wherein the catalyst precursor is positioned proximal to the ionomer-modified structural component; heating the chemical deposition chamber such that the temperature inside the chemical deposition chamber is maintained at an internal temperature sufficient to vaporize the catalyst precursor. In some embodiments, the method can further comprise allowing the internal temperature inside the chemical deposition chamber to cool.

Also disclosed herein are embodiments of a system for selectively depositing a catalyst onto an ionomer, comprising a surface-modified deposition chamber, wherein the chamber comprises an internal chamber surface that is coated with a surface modifier.

The foregoing and other objects, features, and advantages of the disclosure will become more apparent from the following detailed description, which proceeds with reference to the accompanying figures.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 3A is a STEM image showing a platinum-rich layer as a dark layer; FIG. 3B is a HAADF-STEM image showing a platinum-rich layer as a bright layer; and FIG. 3C is magnified image of FIG. 3A.

FIGS. 4A-4C are images of a representative electrochemical component obtained from elemental STEM analysis, wherein FIG. 4A is a fluorine map image showing the fluorine-containing components of the electrochemical component, FIG. 4B is a platinum map showing the selectively deposited platinum catalyst, and FIG. 4C is an image showing that the platinum catalyst does not deposit on the treated portions of the electrochemical component that are not associated with an ionomer (e.g., the circled PTFE strands).

FIG. 5 is an image of a representative electrochemical component obtained from elemental STEM analysis wherein the white line represents an interface between the ionomer impregnated and un-impregnated regions of the microporous layer and a base layer, wherein the majority of the catalyst is found only in the regions occupied by the ionomer in the microporous layer and/or the base layer.

FIG. 6A illustrates the ionomer pattern; FIG. 6B shows the catalyst M shell band; FIG. 6C shows the catalyst L shell band; and FIGS. 6B and 6C show that the catalyst only deposits in the area occupied by the ionomer component.

FIG. 7 is an SEM image of a gas diffusion layer mosaic comprising a collage of images of different sections of a gas diffusion layer comprising a microporous layer having an ionomer component deposited in a particular pattern with a platinum catalyst selectively deposited only in the region occupied by the ionomer.

FIGS. 8A and 8B are schematic illustrations of a representative membrane electrode assembly (or "MEA") component comprising an ionomer component comprising a selectively deposited catalyst; FIG. 8A is cross-sectional illustration of the MEA component and FIG. 8B is a zoomed image of a portion of the MEA illustrated in FIG. 8A.

FIGS. 9A and 9B are photographic images of a CVD deposition surface (FIG. 9A) and back-sides of an ion-exchanged Ce$^{4+}$ DuPont XL membrane (FIG. 9B), wherein the deposition surfaces are uniformly silvered and the back-sides are a high-surface area black.

FIG. 10 is an SEM image of a cross-section of an XL membrane with CVD-deposited Pt catalyst, wherein using the backscatter SEM imaging mode, the high Z number Pt is much brighter than the lighter elements in the membrane and the top ionomer layer is heavily filled with Pt, but the thick expanded PTFE scrim in the XL membrane acts as an effective barrier to the further permeation of Pt.

FIGS. 17A-17C are STEM images, which illustrate platinum nanoparticles dispersed within ionomer films that surround carbon particles/agglomerates; FIG. 17A is an STEM image on a 50 nm scale; FIG. 17B is a STEM image on a 100 nm scale; and FIG. 17C is an STEM image obtained from electron microscopic analysis showing platinum nanoparticles dispersed within ionomer and that illustrate that the platinum nanoparticles do not agglomerate.

FIGS. 19A and 19B are photographic images of two different membrane samples that have been simultaneously coated with a catalyst using a method embodiment described herein and that illustrates that the acidic component of an ionomer may assist with selectively deposition of catalysts; FIG. 19A shows the back surfaces of two different membranes, a sodium ion-form membrane and a proton-form membrane, wherein a platinum catalyst has been deposited on the proton-form membrane, but does not deposit on the sodium-form membrane; and FIG. 19B shows the front surfaces of the two different membranes, again illustrating that substantially less catalyst deposition occurs on the sodium-form membrane.

FIG. 20 is a graph of voltage (V) as a function of current density (A/cm$^2$) showing results obtained from utilizing a fuel cell comprising an electrode functionalized with a representative ionomer component having a selectively deposited catalyst.

DETAILED DESCRIPTION

I. Explanation of Terms

Figure 1:
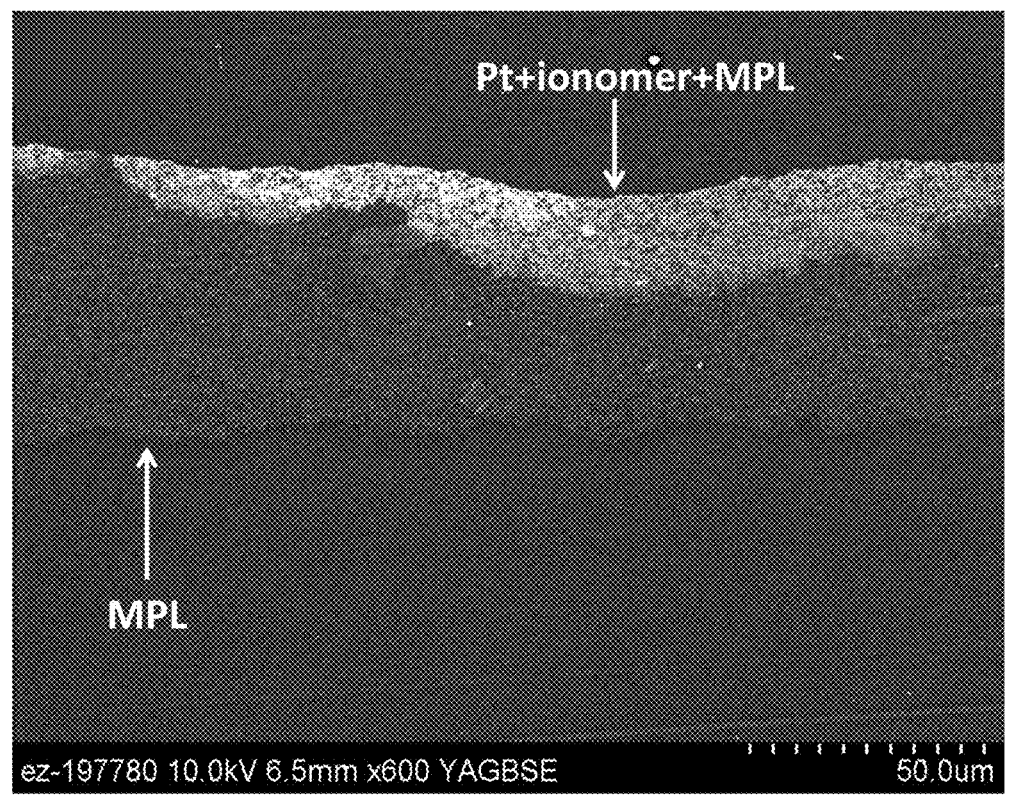
FIG. 1 is an SEM image of a cross-section of a representative electrochemical component comprising a microporous layer that has been partially impregnated with an ionomer component and wherein the ionomer component comprises a selectively deposited catalyst.

The following explanations of terms are provided to better describe the present disclosure and to guide those of ordinary skill in the art in the practice of the present disclosure. As used herein, "comprising" means "including" and the singular forms "a" or "an" or "the" include plural references unless the context clearly dictates otherwise. The term "or" refers to a single element of stated alternative elements or a combination of two or more elements, unless the context clearly indicates otherwise.

Unless explained otherwise, all technical and scientific terms used herein have the same meaning as commonly understood to one of ordinary skill in the art to which this disclosure belongs. Although methods and materials similar or equivalent to those described herein can be used in the practice or testing of the present disclosure, suitable methods and materials are described below. The materials, methods, and examples are illustrative only and not intended to be limiting, unless otherwise indicated. Other features of the disclosure are apparent from the following detailed description and the claims.

Unless otherwise indicated, all numbers expressing quantities of components, molecular weights, percentages, temperatures, times, and so forth, as used in the specification or claims are to be understood as being modified by the term "about." Accordingly, unless otherwise indicated, implicitly or explicitly, the numerical parameters set forth are approximations that can depend on the desired properties sought and/or limits of detection under standard test conditions/methods. When directly and explicitly distinguishing embodiments from discussed prior art, the embodiment numbers are not approximates unless the word "about" is recited. Furthermore, not all alternatives recited herein are equivalents.

To facilitate review of the various embodiments of the disclosure, the following explanations of specific terms are provided:

Catalyst Region: A portion of an electrochemical component or a structural component that comprises an ionomer component and that does not include other portions of the electrochemical component or a structural component that do not comprise the ionomer. In some embodiments, a catalyst region can be located in a microporous layer of a diffusion layer. In yet some other embodiments, a catalyst region can be located in a structural component of an electrochemical device, such as a membrane, a template film, or a conductive support material.

Gas Reactant Access Area: A region of a microporous layer of a diffusion component (e.g., gas diffusion layer) that is adjacent to a base layer of the diffusion component and is not adjacent to a membrane component such that this region is the portion of the microporous layer that is first contacted by gas reactants produced from hydrogen.

Low Surface Energy Material: A material with a surface energy ranging from greater than 0 to 50 $mJ/m^2$. This includes most fluorocarbons and polyolefins. Polymers that contain additional constituents, such as oxygen or nitrogen, will tend to have higher surface energies (e.g., "wet" more easily). High purity carbon surfaces have a low surface energy. Functionalization of the carbon surfaces, by nitric acid or heat treatments, substantially increases the surface energy.

Selectively Deposited: This term refers to catalyst embodiments that are preferentially deposited on (or in the vicinity of) an ionomer component in a catalyst region preferentially over other components of an electrochemical component, such as conductive materials, treatment materials, or structural components, that are not located inside the catalyst region. In some embodiments, "selectively deposited" means that a majority of the catalyst is deposited inside of the catalyst region (and not outside of the catalyst region), such as more than 50% of the catalyst formed from a catalyst precursor is deposited in the catalyst region, or 80% to 100%, or 95% to 100% of the catalyst formed from a catalyst precursor is deposited in the catalyst region (wherein the percentages typically represent weight percent or are determined by measuring an amount ($mg/cm^2$) of the catalyst deposited in a product based on an amount of the catalyst precursor ($mg/cm^2$)). In some embodiments, this term can encompass embodiments where a minor amount (e.g., 0% to 50%, or 0% to 20%, or no more than 5% of the catalyst, wherein the percentages typically represent weight percent or are determined by measuring an amount ($mg/cm^2$) of the catalyst deposited in a product based on an amount of the catalyst precursor ($mg/cm^2$)) of the catalyst obtained from the catalyst precursor is deposited outside the catalyst region and/or embodiments where impurities that might be considered catalysts are located outside the catalyst region.

Structural Component: A component used alone or in combination with other components for carrying out an electrochemical process or for carrying out non-electrochemical catalysis. In some non-limiting embodiments, a structural component can be a membrane, a diffusion component (e.g., gas diffusion layer), a template film or surface, a conductive support material, a sacrificial substrate or film, and the like.

II. Introduction

Conventional polymer electrolyte electrodes used in fuel cells typically use platinum as a catalyst material. Platinum catalysts are not efficiently utilized in conventional electrochemical devices and methods of making such devices, particularly polymer electrolyte fuel cells. For example, it is difficult to match the impregnation depth of the polymer electrolyte with the thickness of a typical catalyst layer within a gas diffusion electrode (GDE), which often has an irregular thickness. As such, different areas of the electrolyte are not fully impregnated with the catalyst and areas of the polymer electrolyte material can extend deeper into the electrode than the catalyst layer. Such irregularities can impede gas diffusion through the electrode. It also is difficult to obtain a high loading (e.g., a high weight percent) of the polymer electrolyte ionomer material to maximize contact between catalyst sites and the ionomer when conventional impregnation techniques are used to prepare the ionomer material. Further, several electrodes used in polymer electrolyte fuel cells utilize binder materials, such as hydrophobic binders, which often block proton and oxygen access to catalyst sites in the electrodes.

Other problems exist with conventional fuel cells. For example, differential swelling between the polymer electrolyte and the catalyst layer arising from the differing hydration characteristics between the hydrophilic polymer electrolyte membrane and the carbon-based electrode structure can result in drawbacks with preparation and efficiency. Delamination can occur between the polymer electrolyte membrane and the electrode, thereby producing undesirable discontinuity in the ion path and decreased cell longevity.

Prior attempts to arrive at electrodes that address the above-mentioned drawbacks of polymer electrolyte electrodes include using low-Pt loading electrodes that consist of carbon-supported Pt nanoparticles and a PTFE binder, which form the top layer of a gas diffusion layer that is subsequently impregnated with ionomer from solution. Other electrodes utilize a catalyst and ionomer solution that is mixed together into an ink used to form ionomer-bound catalyst layers. These electrodes and fabrication methods, however, result in too much of the catalyst being buried too deep in agglomerates or ionomer to promote desired activity. Attempts in the art to circumvent using an ionomer also result in failures as such electrodes require extremely thin catalyst layers to achieve sufficient ionic connectivity. These very thin catalyst layers flood easily (that is, they are easily clogged with product water), which renders the electrodes and fabrication methods impractical for most applications.

Disclosed herein are electrochemical components, such as electrode components, that comprise a selectively deposited catalyst material, wherein the catalyst material is selectively deposited on an ionomer component (e.g., a perfluorosulfonic acid polymer, such as NAFION or AQUIVION) of the electrode. The selectively deposited catalyst provides a solution to the drawbacks of conventional electrodes used in polymer electrolyte fuel cells as it results in increased utilization of the catalyst material by maximizing the amount of catalyst provided without deleterious affecting electronic conductivity, ionic connectivity, and gas reactant access. For example, the selectively deposited catalyst does not block porous pathways within the electrode for gas reactant access and it provides the ability to control the amount of catalyst required to prepare the electrode and thus can avoid having to use large amounts of catalyst material (thereby reducing manufacturing costs). The methods described herein for making polymer electrolyte materials with a selectively deposited catalyst provide an efficient and cost-conscious alternative to conventional methods.

III. Electrochemical Components

Disclosed herein are embodiments of novel electrochemical components comprising a selectively deposited catalyst material. Also disclosed herein are embodiments of devices, such as electrodes and fuel cells, comprising the disclosed electrochemical components. In particular disclosed embodiments, the disclosed electrochemical components are electrode components, but other components are contemplated such as template films, or conductive support materials.

In particular disclosed embodiments, the inventive electrochemical components described herein comprise an ionomer component that has been modified to comprise a selectively deposited catalyst. In embodiments described herein, "selectively deposited" indicates that the catalyst is deposited on, or in the vicinity of, the ionomer component present in a catalyst region of a structural component or an electrochemical component. When the catalyst is deposited on the ionomer component of the electrode, it can be in physical contact with the ionomer component, ionically connected to the ionomer component, and/or electrically connected to the ionomer component. When the catalyst is deposited in the vicinity of the ionomer component, it may but need not necessarily be in physical contact with the ionomer component (for example, it may not be deposited on a surface of the ionomer component or embedded within a layer of the ionomer component), but it typically is deposited in a region of the electrochemical component that comprises the ionomer (that is, none or only a minor amount of the catalyst is deposited in regions outside the catalyst region). For example, the catalyst can be in the vicinity of the ionomer such that it typically is deposited 1000 nm to 0 nm away, such as 50 nm to 0 nm away, or 5 nm to 0 nm away from the ionomer component. In some independent embodiments, a selectively deposited catalyst can be selectively deposited using a mask. In some independent embodiments, a selectively deposited catalyst is selectively deposited without using a mask.

In some embodiments, the ionomer component is deposited on or embedded within a microporous layer of a diffusion layer, such as a gas diffusion layer. In such embodiments, the ionomer component typically is embedded in a catalyst region of the microporous layer and the catalyst is selectively deposited on or in the vicinity of the ionomer component such that it does not deposit outside of the catalyst region. For example, the catalyst does not deposit in other areas of the microporous layer that do not comprise the embedded ionomer component, such as at the interface formed between the microporous layer and the base layer of a gas diffusion layer. In some disclosed embodiments, the selectively deposited catalyst is not deposited on a low surface energy material (e.g., a treatment material, structural component, or conductive component of an electrode) that is not in physical contact with the ionomer component. In yet some additional disclosed embodiments, the catalyst is selectively deposited such that it is in direct physical contact with on the ionomer component of the electrochemical component and no other component of the electrochemical component outside of the catalyst region, such as the conductive components (e.g., carbon fibers; nanostructures, such as carbon nanotubes; and/or carbon catalyst material, such as carbon black) or treatment materials typically used for electrochemical components (e.g., PTFE, such as hydrophobic PTFE, PVDF, silica, such as hydrophilic silica, and the like). However, in some embodiments, appropriate choices of hydrophilic components are utilized, as their typically higher surface energies and chemical functionalities may compete with the ionomer for the preferential catalyst deposition.

Figure 2:
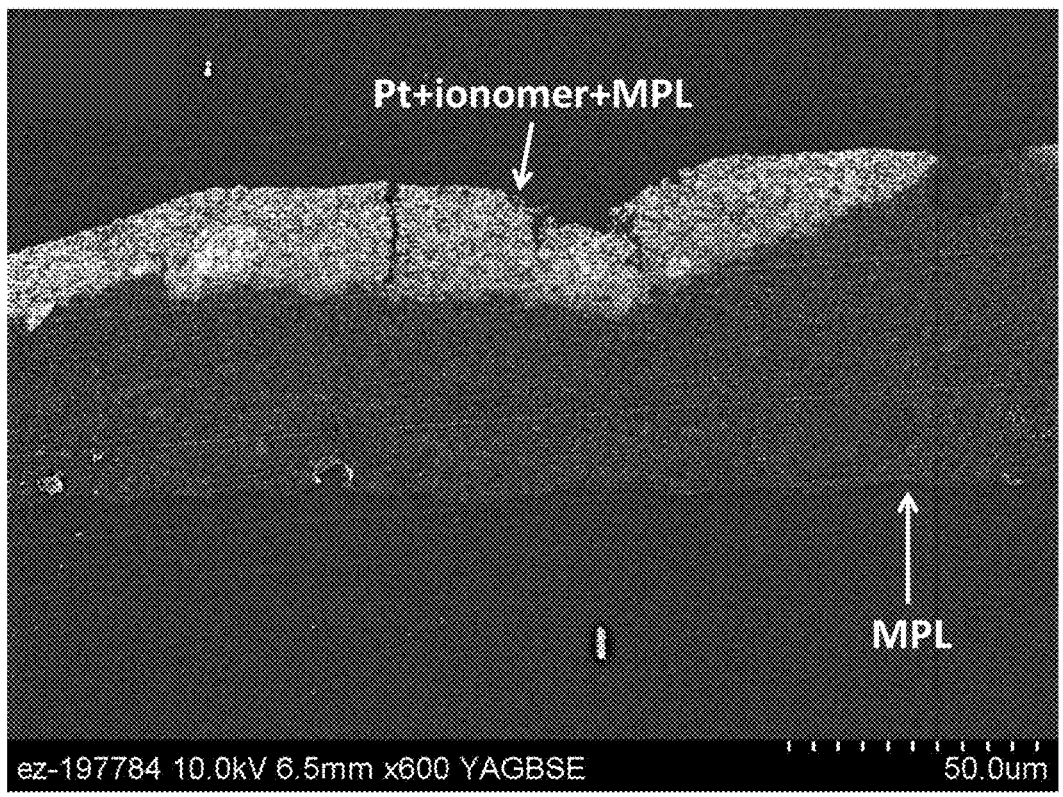
FIG. 2 is an SEM image of a cross-section of a representative electrochemical component comprising a microporous layer that has been partially impregnated with an ionomer component and wherein the ionomer component comprises a selectively deposited catalyst.
Figure 3A:
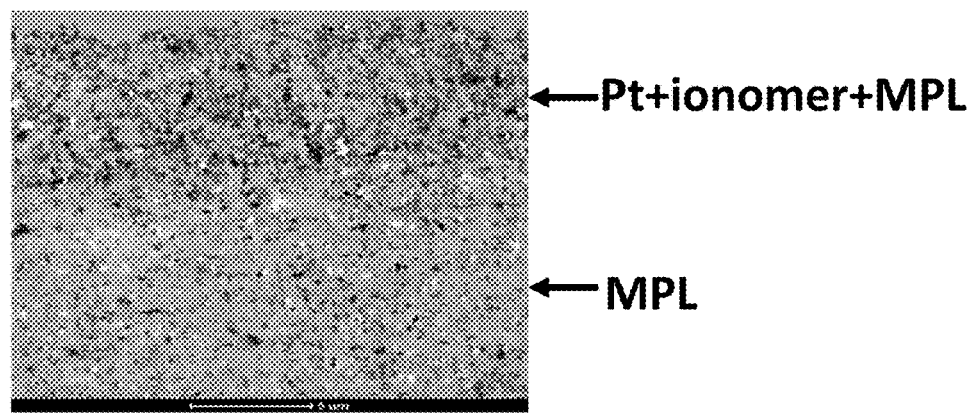
FIGS. 3A-3C are STEM images illustrating catalyst-rich layers of an electrochemical component made using the methods described herein.
Figure 3B:
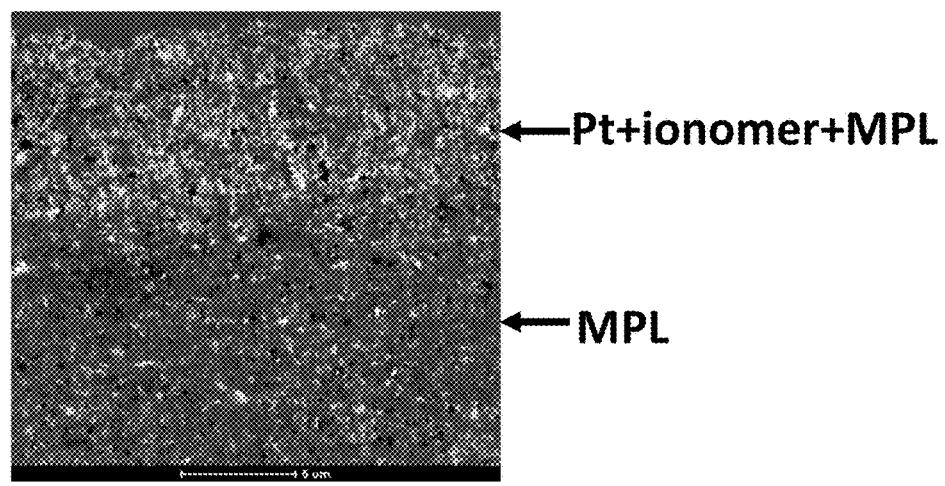
Figure 3C:
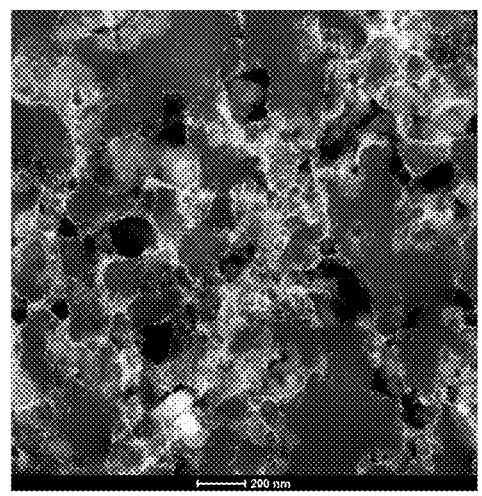

Representative catalyst regions of a microporous layer, wherein the catalyst regions are occupied by an ionomer component and selectively deposited catalyst, are shown in FIGS. 1 and 2. As can be seen in FIGS. 1 and 2, the selectively deposited catalyst is not deposited in regions of the microporous layer that are outside of the catalyst region (wherein the dark areas of FIGS. 1 and 2 are outside of the catalyst region, which is represented by the light areas of FIGS. 1 and 2). Additional embodiments are shown in FIGS. 3A-3C. Also, as can be seen in FIGS. 4A-4C, the catalyst does not deposit on treatment materials (e.g., PTFE) included in the microporous layer that are not associated with an ionomer component. The catalyst (e.g., platinum in red) deposits on or in the vicinity of the ionomer component (the amorphous green F regions), but does not deposit on the PTFE treatment material of the microporous layer (e.g., the strands highlighted in circles A, B, and C). Another image of selectively deposited catalyst is shown by FIG. 5, wherein a majority of platinum is selectively deposited above the white line, which comprises the ionomer component. Very little platinum is deposited below the white line that indicates the extent of the ionomer impregnation.

Figure 6A:
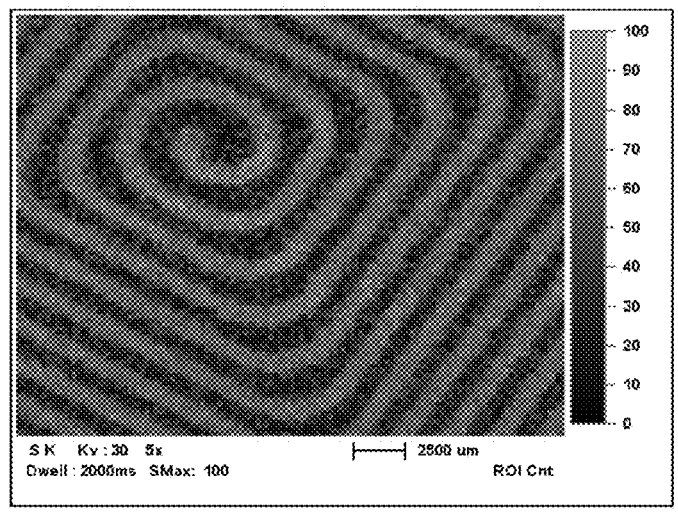
FIGS. 6A-6C are images obtained from X-ray fluorescence analysis of a representative ionomer component deposited in a pattern on a microporous gas diffusion layer and further comprising a selectively deposited catalyst only in the regions occupied by the ionomer.
Figure 6B:
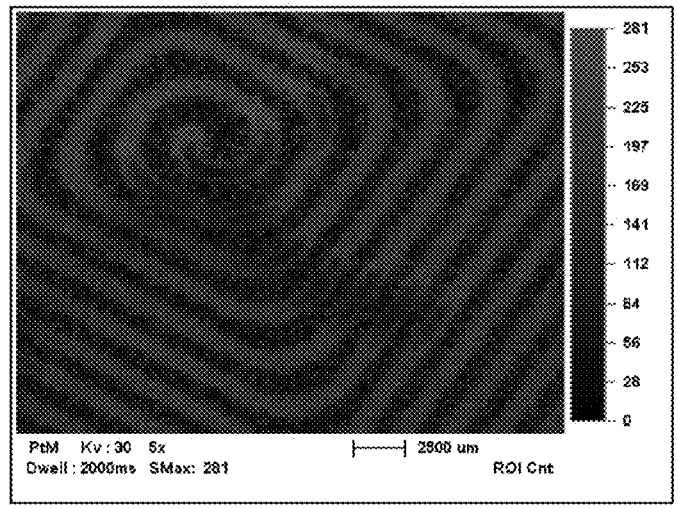
Figure 6C:
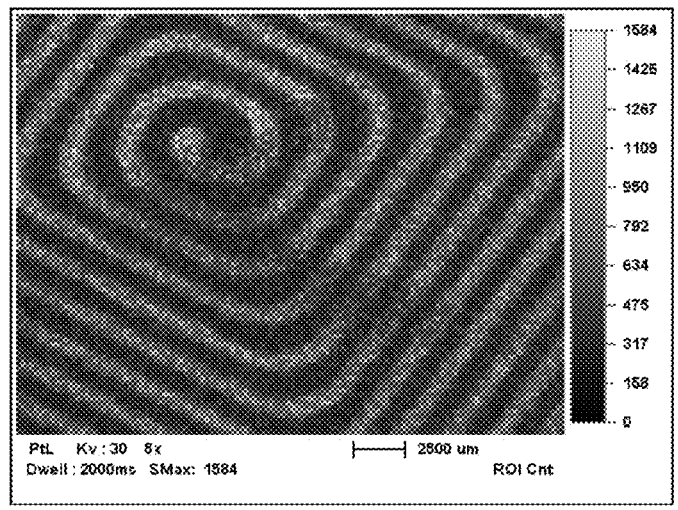

In some embodiments, the ionomer component of the electrochemical component is deposited as a layer on a gas diffusion layer (GDL) material or embedded in a GDL material. The ionomer component can be deposited in a particular pattern on (or embedded in) the GDL material or it can be deposited to coat (or be embedded in) an entire surface of the GDL material. A representative embodiment of a patterned ionomer component on a GDL is shown by FIGS. 6A-6C, which are X-ray fluorescence images of a patterned ionomer component (FIG. 6A) wherein the catalyst is selectively deposited such that it only deposits on or in the vicinity of the ionomer component (FIGS. 6B and 6C). This patterned GDL also is shown in FIG. 7. Because it can be selectively deposited using methods described herein, the catalyst can be deposited such that it forms deposits on the ionomer component that match any deposited pattern of the ionomer component. In particular disclosed embodiments, the catalyst can be selectively deposited as a layer on a surface of the ionomer component, embedded within a layer of the ionomer component, or both. Different methods can be used to determine whether the catalyst is selectively deposited on an ionomer component. In some embodiments, X-ray fluorescence (XRF) imaging can be used to determine selective deposition of the catalyst. In yet additional embodiments, scanning electron microscopy (SEM), scanning transmission electron microscopy (STEM), or other electron microscopy techniques can be used to determine selective deposition of the catalyst.

In some embodiments, the electrochemical component is an electrode comprising a selectively deposited catalyst material on an ionomer component, wherein the electrode further can comprise a diffusion layer (e.g., a GDL), a treatment material, a conductive material, or a combination thereof. In some embodiments, the conductive material of the diffusion layer can comprise carbon fibers, carbon black, carbon nanotubes and other carbon nanostructures, various metal carbides, metal nitrides, metal carbonitrides, conductive metal oxides (doped and mixed-valance oxides, or a combination thereof. In particular disclosed embodiments, the diffusion layer comprises multiple layers, such as a base layer and one or more additional layers, such as a microporous layer. In some embodiments, the microporous layer of the diffusion layer comprises carbon black and a binder material, such as PTFE. In some embodiments, the base layer is a non-woven base layer that comprises carbon fibers and a treatment material, such as PTFE. In exemplary embodiments, the diffusion layer is a GDL comprising non-woven carbon paper (which serves as the base layer) which comprises a PTFE-treated microporous layer, with a particular example being a SIGRACET GDL. As discussed above, the catalyst is selectively deposited on (or in the vicinity of) the ionomer component of an electrode and therefore is not deposited on any of the other components of the electrode, such as the diffusion layer, the conductive materials, the treatment materials, or any other structural components. FIGS. 8A and 8B provide schematic illustrations of a representative electrochemical component (e.g., a membrane electrode assembly, or "MEA") comprising an ionomer component and a selectively deposited catalyst. With respect to the MEA embodiment 800 illustrated in FIG. 8A, the cell comprises two microporous layers 802, a membrane 804, two GDL layers 806, and an ionomer component 808 comprising a selectively deposited catalyst. FIG. 8B shows a zoomed illustration of the interface between the ionomer component 808 and membrane 804 as well as the porous nature of the microporous layer 802 and the ionomer component 808. As illustrated in FIG. 8B, the selectively deposited catalyst 810 is reactant accessible (represented by pores 812) and is ionically connected to the ionomer component 808.

In additional embodiments, the electrochemical component can be a membrane, such as an ionomer membrane. In such embodiments, the membrane can comprise an ionomer component (which can be separate from the ionomer of the membrane or that can be the ionomer that makes up the membrane) with a selectively deposited catalyst. In embodiments where the ionomer component is separate from the ionomer of the membrane, the catalyst is selectively deposited on the ionomer component and is not deposited on portions of the membrane that does not comprise the ionomer component. For example, the membrane can comprise an ionomer that is in a metal-ion form (e.g., Na-forms of a perfluorosulfonic acid polymer, such as NAFION or AQUIVION) and the ionomer component can comprise an ionomer in a proton form (e.g., H-forms of a perfluorosulfonic acid polymer, such as NAFION or AQUIVION). The membrane can be acidic or alkaline. In some embodiments where the ionomer component is the ionomer of the ionomer membrane, the catalyst can be selectively deposited such that a pattern is provided via masking. Masking is discussed herein and can comprise using physical mask, such as a film, screen, template, or the like, to block deposition; or a chemical mask, which involves using a chemical species to block deposition. In some embodiments using a chemical mask, ionic species (e.g., Na+) can be applied to a membrane to prevent deposition of the catalyst (or catalyst precursor).

An ionomer membrane that is modified to have a high catalyst deposition amount can be used as an electrolyzer electrode. Such electrodes are useful in water electrolysis as the highly-loaded membranes can maximize the interfacial area between catalyst and ionomer while also maximizing electronic conductivity without the use of conductive supports, such as carbon black. The methods described herein can thus be used to make an effective electrolyzer electrode having good catalyst particle connectivity within the ionomer and wherein the catalyst extends to and across the ionomer surface to provide electronic conductivity to an underlying current collector (thus across the electrode regions bridging the openings in the porous current collector). The current collector can comprise a metal, such as titanium, and can be in the form of a screen, foam, or felt. Good catalyst particle connectivity can be obtained as long as penetration of the catalyst is not too deep and dispersed. In some embodiments, observing the presence of a "silvered" or "mirrored" membrane surface is one method of confirming that the electrode has a continuous metallic pathway for conductivity. Examples of such "silvered" or "mirrored" surfaces are shown in FIG. 9A for platinum cathodes. In the electrolyzer electrode embodiments discussed above, the anode catalyst typically is selected to be iridium and is used for the anode component of the electrolysis cell; however, in some embodiments, a mixture of iridium and platinum also can be used. Suitable iridium catalyst precursors are described herein.

In some embodiments, the electrochemical component can further comprise a permeation barrier. The permeation barrier can facilitate limiting the amount of catalyst penetration. In some embodiments, the permeation barrier can comprise a porous, ionomer-filled, expanded PTFE scrim that is used to reinforce a membrane. The scrim behaves as a physical barrier that limits the depth of catalyst penetration, as shown in FIG. 10. In some embodiments with differing Pt loadings, the Pt typically can fill the first ionomer layer to the scrim and then its density and grading can be varied by modifying the loading amount. Consequently, intentionally placing the scrim closer to the surface (thinner ionomer layer) helps to narrow and densify the catalyst deposition.

In yet additional embodiments, the electrochemical component can be a free-standing ionomer component that is formed on a template film or a sacrificial film. The template film or sacrificial film can be used as a temporary structural support upon which the ionomer component is deposited to thereby provide a template for selective catalyst deposition. In such embodiments, once the ionomer component is modified to comprise the selectively deposited catalyst, the temporary structural support can be physically removed or can be etched away to expose a free-standing ionomer component. Such free-standing ionomer components can be inserted between a GDL and an ionomeric membrane in an electrochemical cell. Also, in such embodiments, all of the catalyst is reactant accessible, and not buried. Alternatively, a structural web can be used in combination with the free-standing ionomer component, such as carbon nanotubes, carbon fiber webs, expanded PTFE, and any other suitable electrospun, expanded, self-assembled, micro-etched, anodized, vapor grown, templated, or additive manufactured reinforcing structure. In yet additional embodiments, the self-standing ionomer component can comprise an ionomer component deposited on a free-standing microporous layer that does not comprise an associated base layer. In some embodiments, a free-standing ionomer component, such as an ionomer-modified membrane, can be modified to further comprise a porous component. As acid functional groups in a free-standing membrane surface tend to face inwards, leaving an inactive surface on the membrane surface, acid-catalyzed deposition typically is initiated and continues beneath this inactive surface. The porous component can be used to help facilitate deposition on the inactive surface of the membrane. For example, a removable powder or web material could be temporarily applied to the membrane to concentrate the deposition density.

Figure 11:
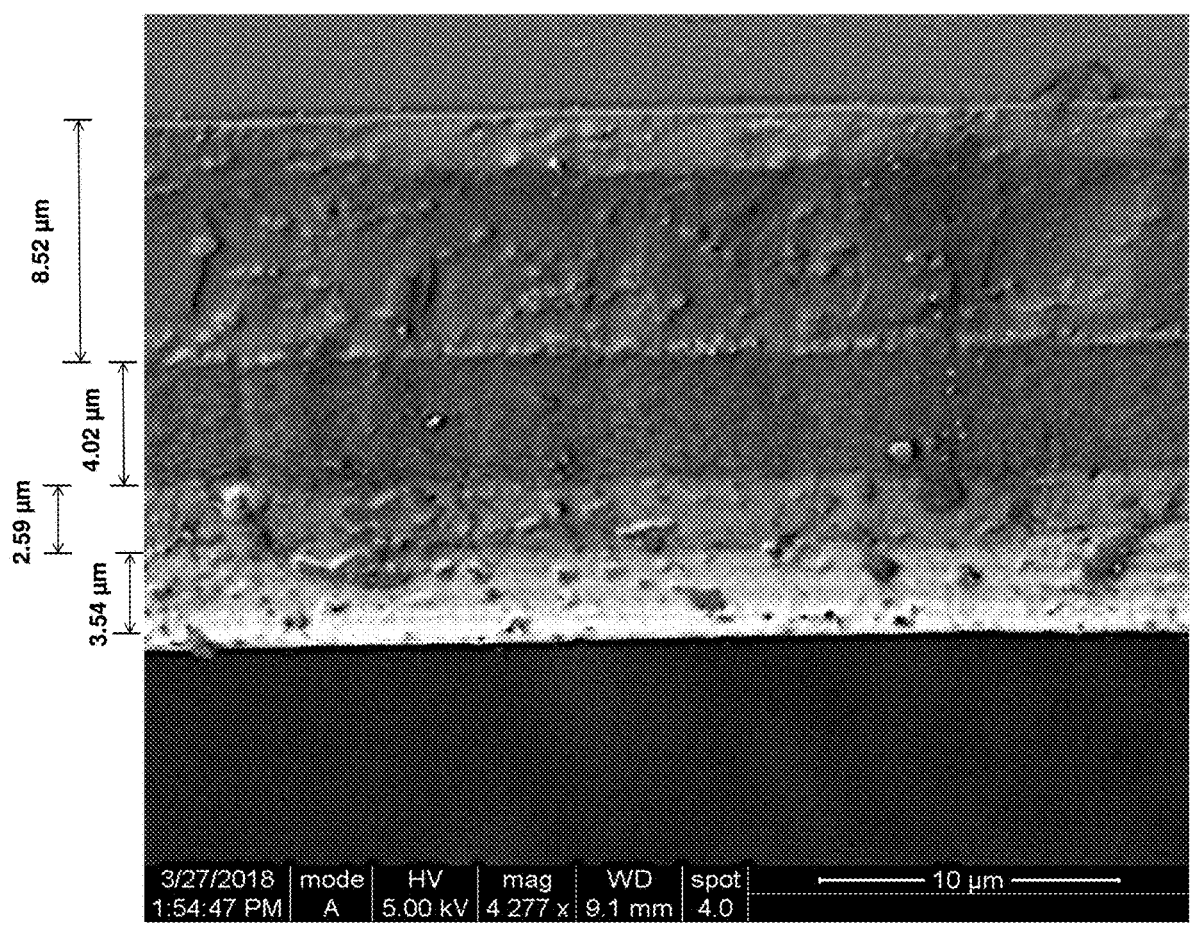
FIG. 11 is an SEM back-scatter image of a cross-section of a membrane wherein Pt is applied using CVD with the microporous side of a GDL contacting the membrane surface.

In one exemplary embodiment, the microporous side of a GDL was placed against a membrane and Pt was deposited, using an average loading of 0.73 mgPt/cm$^2$. Much of the deposition occurred at or near the interface, and thus the catalyst penetrated less into the membrane as shown by FIG. 11. In the SEM image shown in FIG. 11, the back-scattered (brighter) Pt layer penetrates only about 3.5 um into the membrane, about half as deep as roughly equal deposition loadings on uncovered surfaces. Surface conductivity (by ohm-meter) was also substantially higher than with un-silvered surfaces on other electrodes.

The electrochemical component also can be an electrically conductive support, such as carbon. High catalyst dispersion can be achieved on such supports using the components and methods described herein. In such embodiments, the electrically conductive component does not need to support catalyst and consequently can be highly corrosion tolerant, such as highly graphitized carbon.

The catalyst can be a platinum catalyst, such as platinum or an alloy thereof; a palladium catalyst or an alloy thereof; an iridium catalyst or an alloy thereof; a nickel or nickel alloy catalyst; a silver or silver alloy catalyst; or any combination thereof. Representative catalysts for PEFCs are platinum cobalt ($Pt_3Co$) and platinum nickel ($Pt_3Ni$). In some such embodiments, the $Pt_3Co$ is a crystalline alloy. In some embodiments, a $Pt_3Co$ alloy can be obtained by co-depositing (via CVD) platinum and cobalt onto an ionomer (or an ionomer-modified component) using the respective acetylacetonate precursors. Representative catalysts for oxygen evolution in water electrolysis are iridium or iridium alloy catalysts (e.g., iridium(III) acetylacetonate ("Ir(acac)$_3$"), acetylacetonato(1,5-cyclooctadiene)iridium(I) ("Ir(acac)(cod)"), or acetylacetonato(dicarbonyl) iridium(I) ("Ir(acac)(CO)$_2$"). Representative catalyst for sensors include palladium or palladium alloy catalysts. In some polymer alkaline electrolyte cell embodiments, the catalysts could be nickel, silver, alloys thereof, or any combination thereof. In particular disclosed embodiments, the amount of the catalyst that is deposited on the ionomer can range from 0.005 mg/cm$^2$ to 5 mg/cm$^2$ of the geometric area, such as 0.01 mg/cm$^2$ to 1 mg/cm$^2$, or 0.05 mg/cm$^2$ to 0.2 mg/cm$^2$. In some embodiments used for water electrolysis, the amount of catalyst that is deposited on the ionomer can range from 0.01 mg/cm$^2$ to 10 mg/cm$^2$, such as 0.05 mg/cm$^2$ to 5 mg/cm$^2$, or 0.1 mg/cm$^2$ to 0.5 mg/cm$^2$.

IV. Methods

Disclosed herein are novel methods for making electrochemical components comprising an ionomer component comprising a selectively deposited catalyst. In particular disclosed embodiments, the methods can comprise dispensing or depositing an ionomer-containing solution (e.g., a composition comprising the ionomer and a suitable solvent, such as a solvent having a dielectric constant greater than 10) onto a surface of and/or embedded in a structural component (e.g., a membrane, a gas diffusion layer, a template film, or a conductive support material) to form an ionomer-modified structural component. In particular disclosed embodiments, the solvent can be selected from aqueous solvents, an aqueous/organic solvent mixture, or non-aqueous solvents, such as DMF, DMC, or various neat alcohols. The ionomer component can be deposited as a layer on a surface of the structural component, embedded within the structural component, and in some embodiments can be deposited/embedded in a pre-determined pattern. In yet additional embodiments, a dispensing step is not needed and instead a membrane comprising a pre-embedded ionomer is used.

In particular disclosed embodiments, the structural component is an electrochemical component, such as a diffusion layer (e.g., a gas diffusion layer) that can comprise a base layer and/or a microporous layer, wherein either such layer further comprises a treatment material, a conductive material, or a combination thereof. In some embodiments, the surface of such an electrochemical component can be coated with the ionomer component such that all (e.g., 100% of the surface area of the electrochemical component) or a substantial portion (e.g., 50% to 99% of the surface area of the electrochemical component, such as 50% to 95%, or 60% to 90% of the surface area of the electrochemical component) is covered with the ionomer component. In some embodiments, the ionomer is deposited as a layer on or impregnated into the surface of the electrochemical component, wherein the layer has a thickness ranging from 0.1 μm to 100 μm, such as 1 μm to 20 μm, or 5 μm to 10 μm.

In yet additional embodiments, the ionomer component can be embedded within the electrochemical component. In such embodiments, the ionomer component typically extends into the electrochemical component at distances ranging from 0.1 μm to 20 μm from a surface of the electrochemical component. For example, the ionomer component can be impregnated within a microporous layer of a diffusion layer, such that the ionomer component is embedded in a catalyst region of the microporous layer, which can comprise the area at and/or below a membrane-facing surface of the microporous layer and that extends into the microporous layer at distances ranging from 0.1 μm to 100 μm from the membrane-facing surface of the microporous layer, such as 1 μm to 20 μm, or 5 μm to 10 μm deep in the microporous layer. In yet additional embodiments, the surface of the electrochemical component can be patterned with the ionomer such that a pre-determined pattern of the ionomer is applied to the electrochemical component.

The method can further comprise drying the dispensed (or deposited) ionomer solution on the structural component. In some embodiments, an affirmative drying step can be used wherein the structural component is exposed to heat or an inert gas is passed over the structural component. In yet other embodiments, the drying step can simply comprise allowing the ionomer solution to dry naturally, such as by allowing the solvent of the ionomer solution to evaporate under ambient conditions.

After a drying step, the ionomer-modified structural component can be exposed to a catalyst precursor, such as a platinum precursor like Pt(II)acetylacetonate (or "Pt(acac) 2"), a palladium precursor (e.g., Pd(II)acetylacetonate or "Pd(acac)$_2$"), an iridium precursor (e.g., Ir(acac)$_3$), a ruthenium precursor (e.g., Ru(acac)$_3$), a Pt alloy with non-precious metals (e.g., Pt$_3$Co made using Pt(acac)$_2$ and Co(acac)$_2$; or Pt$_3$Ni made using Co(acac)$_2$ or Ni(acac)$_2$), or any other Pt, Pd, Ru, and/or Ir alloy. The catalyst precursor is used to provide the catalyst (e.g., platinum) that becomes selectively deposited on the ionomer component. In some embodiments, the exposure step can be conducted in a chemical deposition chamber that comprises an internal chamber surface that either comprises a low surface energy material or is coated with a surface modifier, such as PTFE. For example, the method can comprise positioning the ionomer-modified structural component and the catalyst precursor in the chemical deposition chamber such that the catalyst precursor is positioned proximal to a surface of the structural component that does not comprise the ionomer (e.g., above or below a surface of the structural component that does not comprise the ionomer). In some embodiments, proximal includes embodiments wherein the catalyst precursor is positioned directly adjacent to the structural component such that they contact one another. In yet additional embodiments, proximal can include embodiments wherein the catalyst precursor does not contact the structural component, but includes a space between it and the structural component. In some embodiments, there may or may not be an intervening component occupying the space between the structural component and the catalyst precursor.

Figure 12:
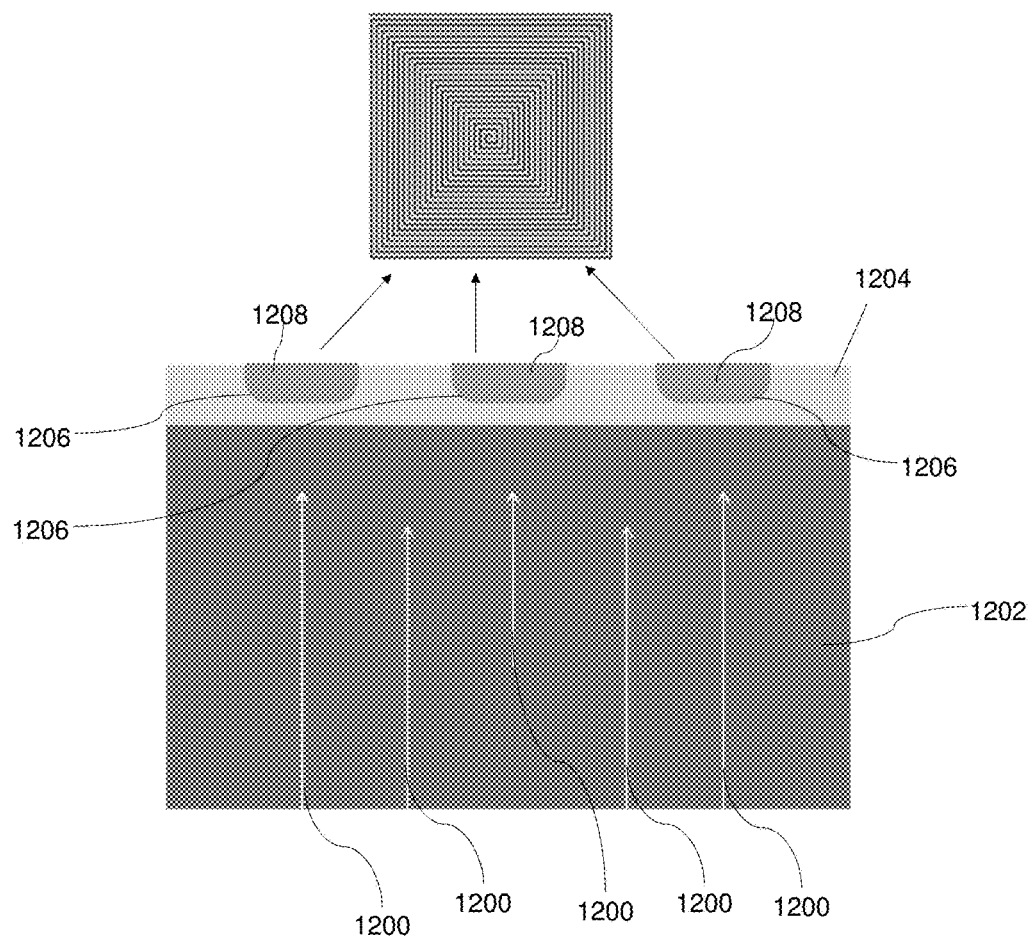
FIG. 12 is a schematic illustration of a representative embodiment of an ionomer component embedded in a microporous layer of an electrochemical component described herein, wherein arrows 1200 illustrate the pathway of a catalyst precursor that selectively deposits a catalyst on the ionomer.
Figure 13:
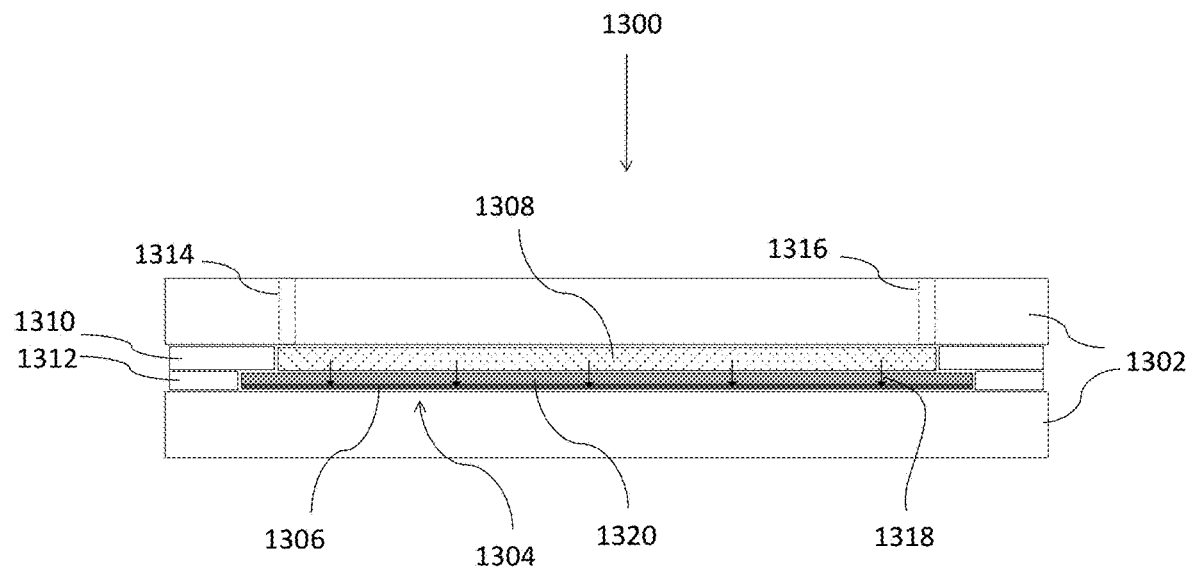
FIG. 13 is a cross-sectional illustration of a representative system set-up used in method embodiments described herein wherein chemical vapor deposition in a chemical deposition chamber is used.

In some embodiments, the method further comprises heating the ionomer-modified structural component and the catalyst precursor at a temperature sufficient to vaporize the catalyst precursor. In yet some additional embodiments, a similar heat treatment can be used as a post-treatment after the electrochemical component has been fabricated to further concentrate the catalyst near the surface of a membrane of the electrochemical component. In some embodiments, heating takes place by heating the chemical deposition chamber such that the temperature inside the chemical deposition chamber is maintained at an internal temperature sufficient to vaporize the catalyst precursor. For example, the temperature can range from 110° C. to 300° C., such as 120° C. to 200° C., or 135° C. to 145° C. Similar temperatures can be used for post-treatment heating as discussed above; however, the heating need not be carried out in the chemical deposition chamber and can be carried out in a conventional heating apparatus (e.g., an oven). The chamber can be heated for a time sufficient to vaporize all of the catalyst precursor or a particular amount of the catalyst precursor. In some embodiments, the chamber can be heated for 5 minutes to 2000 minutes, such as 150 minutes to 1500 minutes, or 500 minutes to 1000 minutes. Once vaporized, the catalyst precursor can pass through the structural component (e.g., a diffusion layer or other porous substrate) and travel to the ionomer component deposited in one or more catalyst regions of the structural component to thereby deposit a catalyst on the opposite surface of the structural component from the surface facing the catalyst precursor. FIG. 12 provides a schematic illustration of a representative embodiment wherein the vapor produced from the catalyst precursor (represented by arrows 1200) travels through a base layer component 1202 of a diffusion layer into the microporous layer 1204 and then selectively deposits the catalyst 1206 in the catalyst region (defined by the outer edges of catalyst 1206 and ionomer component 1208) wherein the ionomer component 1208 is present and not in other regions of the electrochemical component. FIG. 13 is a cross-sectional schematic illustration of a representative set-up 1300 using the disclosed method and the disclosed chemical deposition chamber. As illustrated in FIG. 13, a chemical deposition chamber 1302 surrounds a structural component, such as gas diffusion layer 1304 that comprises an embedded ionomer component in catalyst region 1306. A porous PTFE sheet containing catalyst precursor 1308 is positioned proximal to the gas diffusion layer 1304 such that it is positioned above the gas diffusion layer 1304. The chemical deposition chamber 1302 can also house alignment masks 1310, chamber edge seals 1312, inlet 1314, and outlet 1316. As illustrated in FIG. 13, the catalyst precursor vapor (represented by arrows 1318) is able to travel through the base layer 1320 of the gas diffusion layer 1304 and into the catalyst region 1306 comprising ionomer component. The method then comprises cooling the chemical deposition chamber so that its internal temperature is reduced from the heating temperature. Cooling can take place by an affirmative cooling step or by simply removing the chamber from a heat source (e.g., a heating oven) or reducing the temperature of a heating element or heat source.

In some embodiments, the methods can further comprise masking the ionomer-modified structural component with a mask material that covers the surface of the structural component onto which the ionomer solution was deposited and/or humidifying the chemical deposition chamber (e.g., by introducing a humidified inert gas into the chamber and/or introducing water vapor into the chamber) before heating takes place, during heating, or a combination of before and during heating. In some embodiments, it is currently believed that the small amount of water introduced (e.g., by pre-purging with humidified N$_2$) may increase the ionomer surface energy and hence the sticking coefficient of the catalyst, catalyst precursor, and/or the ionomer component, or it may enhance the proton activity and mobility thereby facilitating reduction of the catalyst precursor, or it may actively participate in the decomposition and/or deposition reactions.

In yet some additional embodiments, the method can further comprise using active agents to accelerate catalyst deposition. In such embodiments, the method can further comprise exposing a catalyst precursor, the ionomer, an ionomer-modified structural component (e.g., a membrane or a GDL), or a combination thereof to an active agent (such as an oxidant), an acid, or a combination thereof. Suitable oxidants can include, but are not limited to, O$_2$, H$_2$O$_2$, nitrous oxide, nitrogen dioxide, ozone, and cerium ions (e.g., Ce(IV), as provided by a cerium (IV) precursor, such as Ce(SO$_4$)$_2$ or (NH$_4$)$_2$Ce(NO$_3$)$_6$), hexavalent chromium, or the like. The cationic oxidants can be used with, for example, acidic membranes. In some embodiments, the oxidant can be an anionic species, such as perchlorate, nitrate, perborate, permanganate. Such oxidants can be used with, for example, alkaline membranes. In some embodiments, the active agent can be added during chemical vapor deposition of the catalyst (or a catalyst precursor). In such embodiments, the active agent can be introduced into the chamber housing the ionomer-modified component concurrently or sequentially with water vapor introduced into the chamber. Another variation of this method can involve pumping a solution of the active agent into the chamber such that it contacts one side of the ionomer-modified component and can thus diffuse through the ionomer-modified component to a deposition side of the ionomer-modified component. In some other embodiments, the active agent can be introduced by embedding it or ion-exchanging it into the ionomer (or ionomer-modified component) prior to catalyst (or catalyst precursor) deposition. For example, the active agent can be mixed with an ionomer solution used to make an ionomer-modified component, or the ionomer-modified component can be immersed in a solution of the active agent. A solution of the active agent can be an aqueous-based solution, an organic solvent-based solution, or a combination thereof. In such embodiments, the active agent can be selected to be compatible with the ionomer-modified component (e.g., such as when a proton-conducting membrane is used) and/or can be used in combination with an acid (e.g., dilute sulfuric acid) to further improve loading of the active agent and avoid reducing or deleteriously impacting the ionomer-modified component (e.g., such as avoiding reducing the membrane's protonic activity). The active agent can be added such that loading amounts of 1% to 100% (or greater) of the theoretical capacity can be achieved, such as 50% to 100%, or 70% to 95%, or 85% to 90%.

Figure 14:
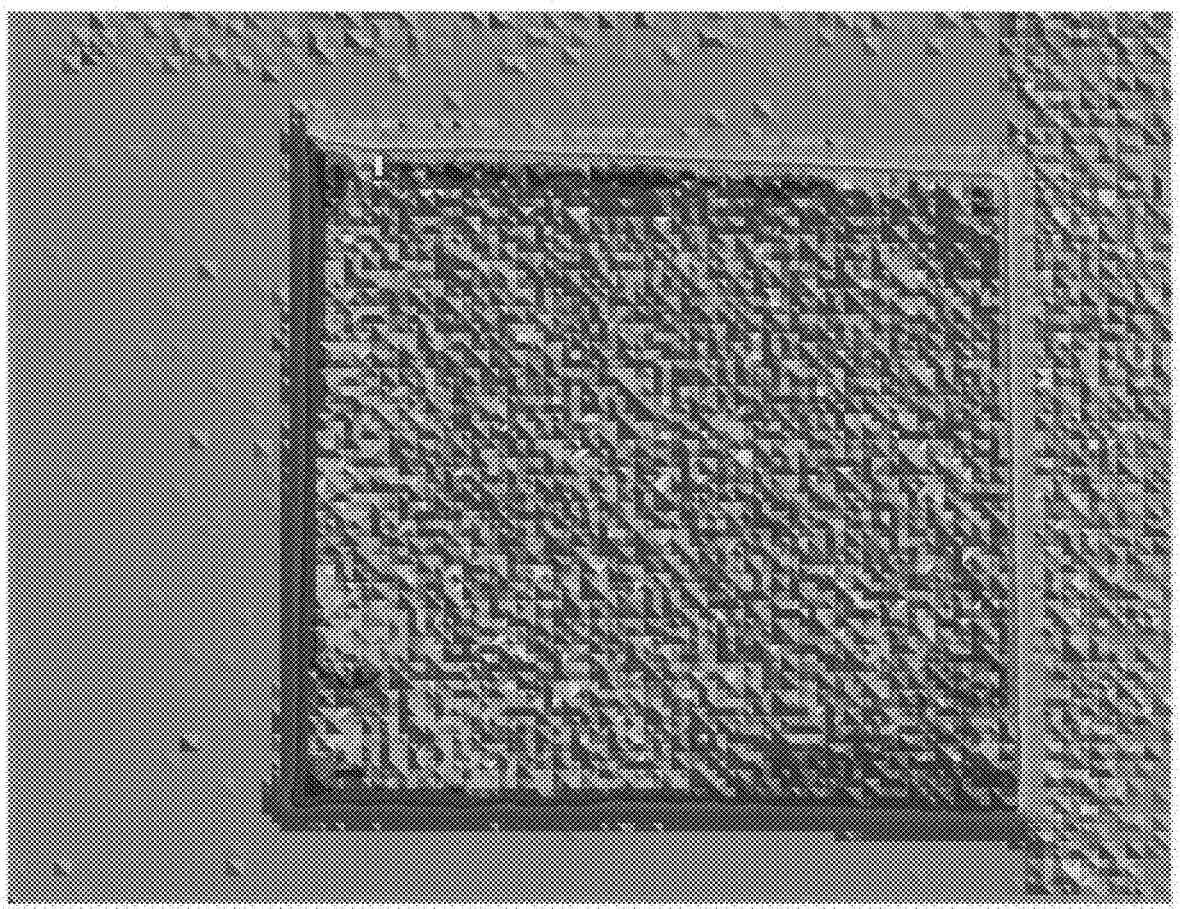
FIG. 14 is a scanning x-ray fluorescence (XRF) image of the surface of a 0.5"×0.5" section of the electrode shown in FIGS. 9A and 9B, which illustrates that the Pt loading is very uniform across the deposition area.
Figure 15:
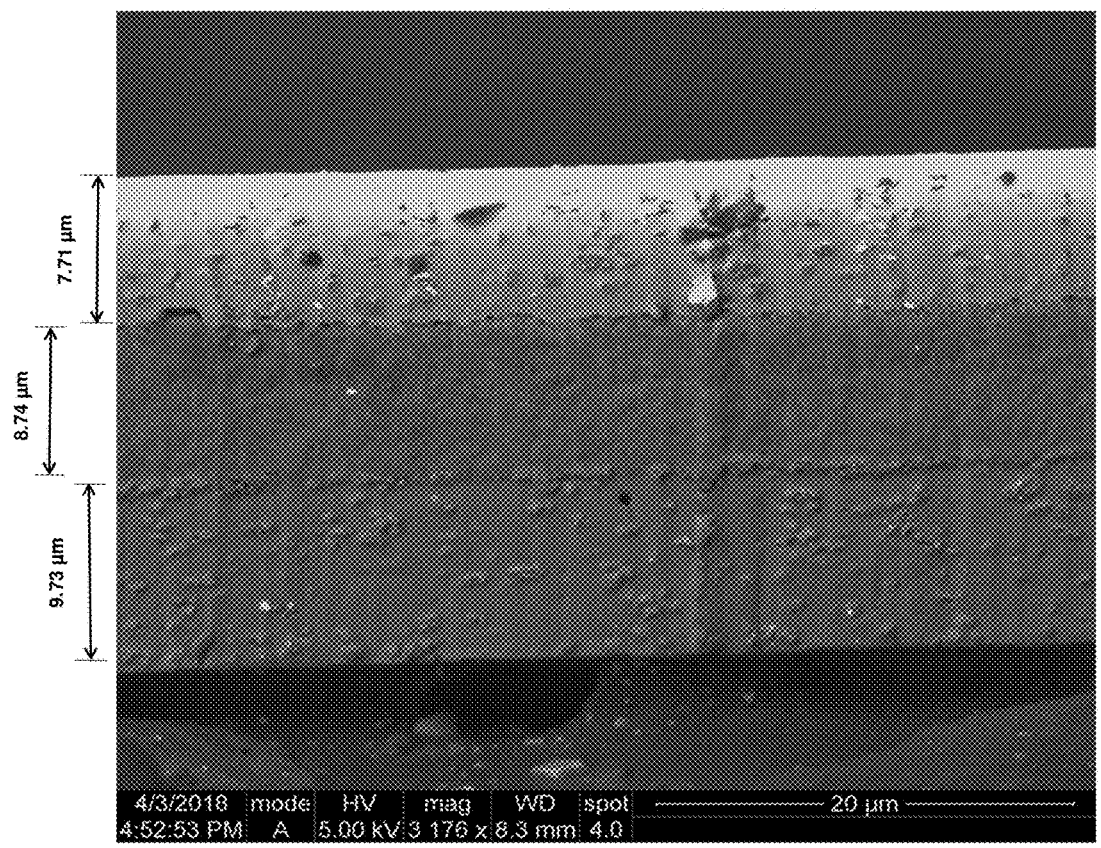
FIG. 15 is an SEM back-scatter image of an electrode shown by FIGS. 9A and 9B, wherein it can be seen that while some of the Pt has penetrated to the scrim, the concentration is markedly higher near the top edge.
Figure 16:
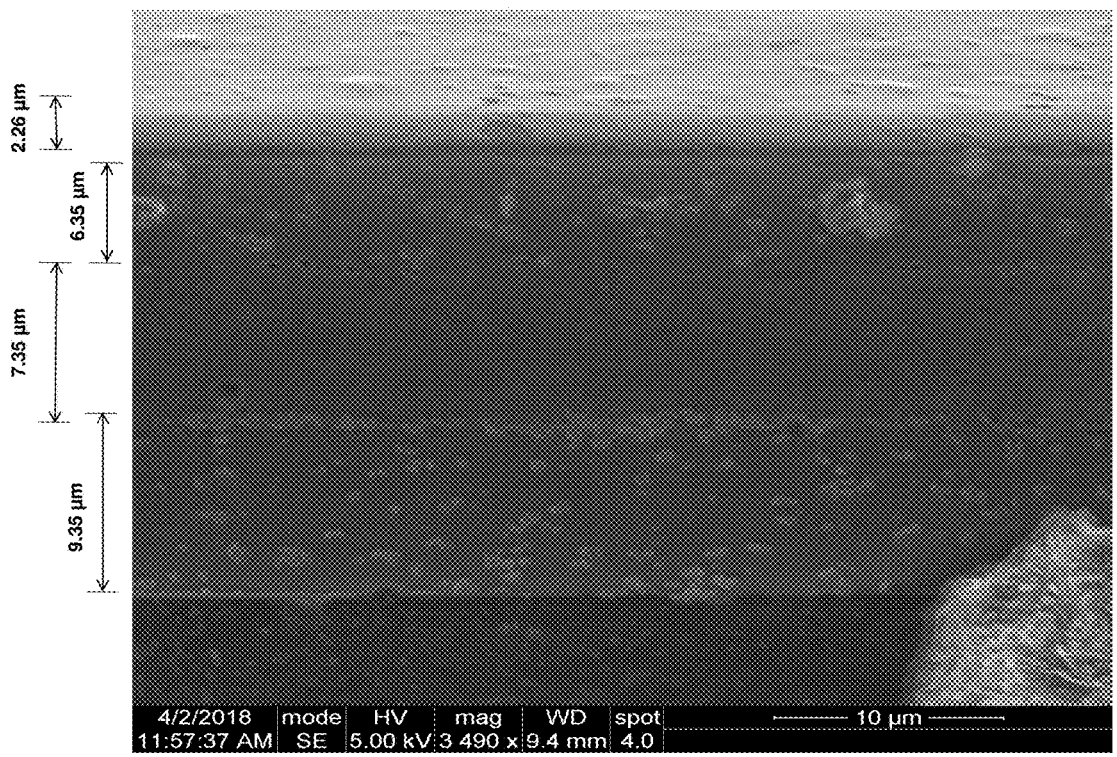
FIG. 16 is an SEM image obtained using a secondary electron imaging mode, which shows a much more dramatic transition from heavily to lightly concentrated Pt regions.
Figure 17C:
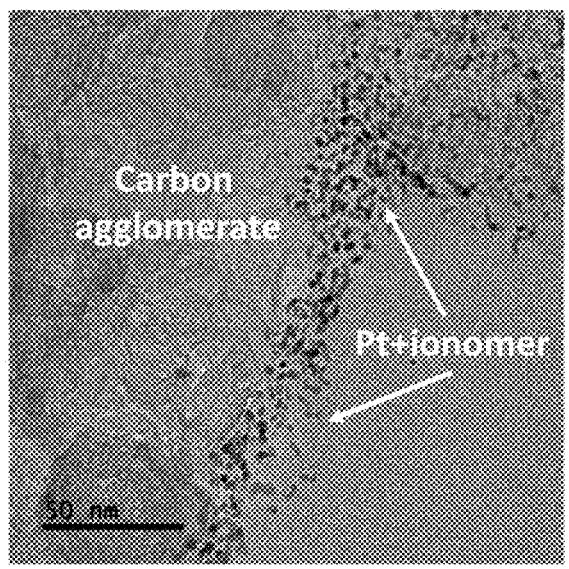
Figure 17C:
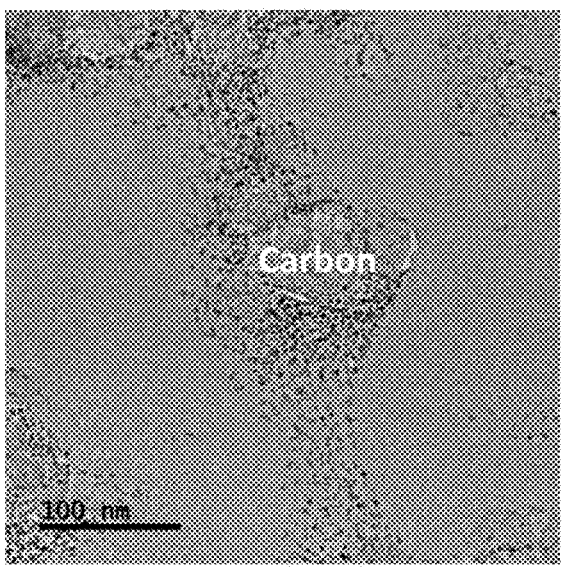
Figure 17C:
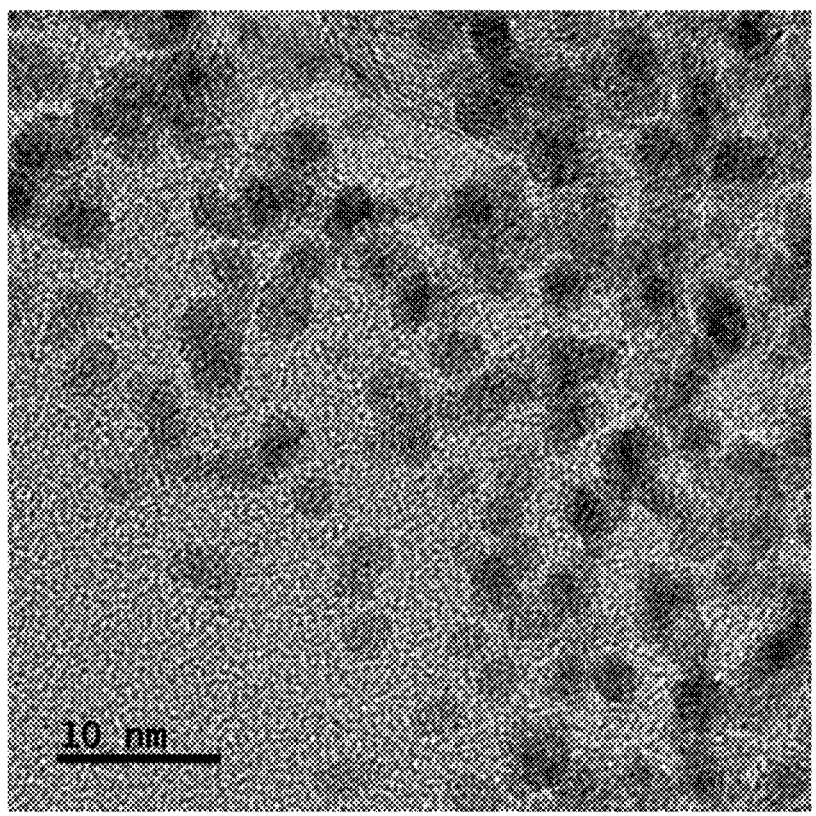
Figure 18:
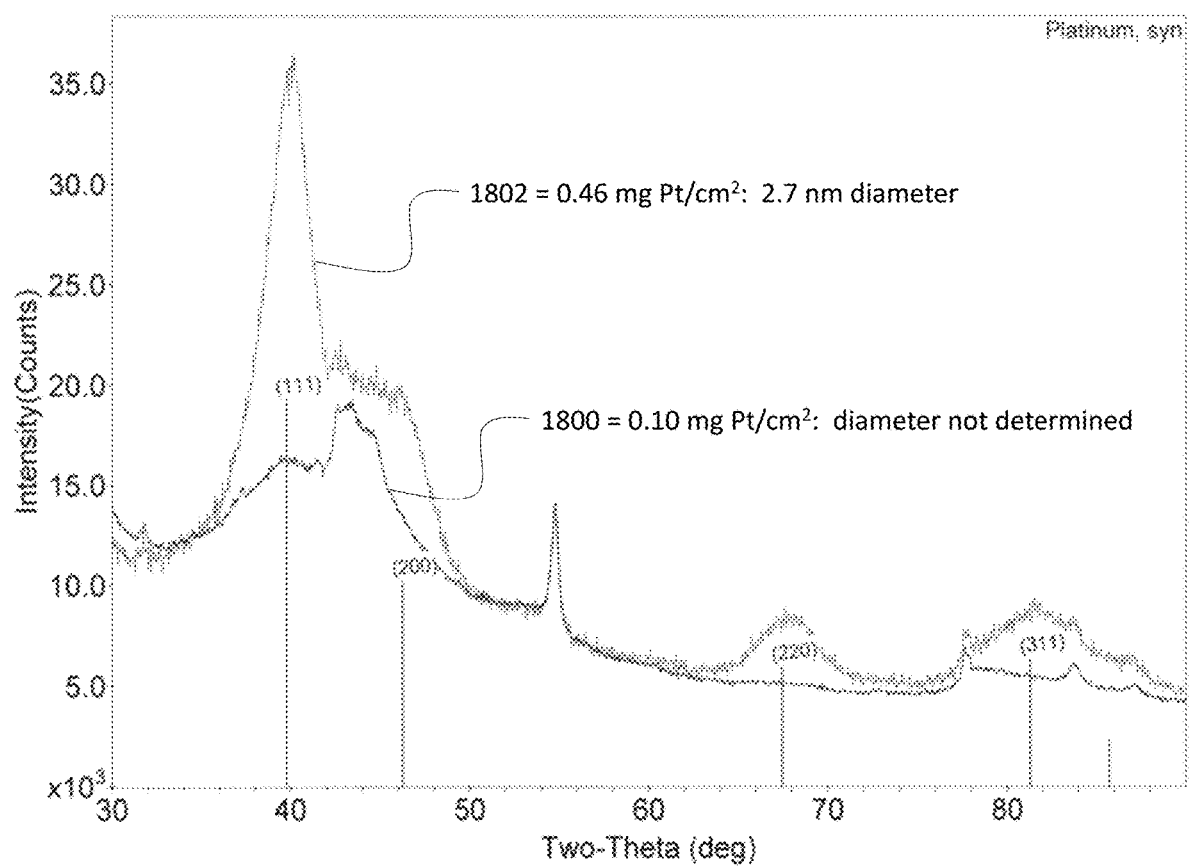
FIG. 18 is an XRD spectrum obtained from analyzing an electrochemical component described herein wherein a platinum catalyst has been selectively deposited in amounts of 0.1 mg/cm$^2$ and 0.46 mg/cm$^2$.

In an exemplary embodiment, cerium (IV) was loaded in an amount of 120 ug/cm$^2$ on an ionomer-modified membrane, about two-thirds of the theoretical ion exchange capacity. Images of the membrane from this exemplary embodiment are provided by FIGS. 9A and 9B. With reference to FIGS. 9A and 9B, 0.62 mg Pt/cm$^2$ loading was achieved and the entire electrode surface was uniformly silvered (or mirrored) as shown by FIG. 9A. Probing with an ohm-meter indicated good electronic conductivity across the entire surfaces of the individual electrodes. FIG. 9B shows the back-side of the membrane and electrodes with a black (high surface area) interface. As can be seen by FIGS. 9A and 9B, the Ce(IV) oxidizing agent facilitates pushing the deposition reaction zone closer to the surface and then uniformly across each electrode. Catalyst deposition and uniformity also is shown by FIG. 14, which is a scanning XRF of the Pt L line of a 0.5"×0.5" piece cut from one of the electrodes shown by FIGS. 9A and 9B. Compared to the XRF scan shown in FIG. 23 (discussed below), the Pt distribution is quite uniform and there appears to be little or no edge accumulation effect. Further, FIGS. 15 and 16 show distinctly greater concentration of the Pt deposition near the surface. While the back-scatter image in FIG. 15 shows that some of the Pt does make it to the scrim, the intensity is much greater in the top 2-3 um of the sample. FIG. 16 does not image the Pt per se, but confirms that the morphology of the top 2-3 um of the sample is so entirely different from the rest of the ionomer layer that it appears as a separate distinct layer, presumably because of the high Pt concentration. The roughly 2 um thick light-colored layer appears to sit on top, but is actually intercalated into the ionomer layer. Without being limited to a particular theory, it currently is believed that a heavy Pt loading may enhance the emissivity and brightness of this particular layer.

Using the disclosed methods, the catalyst becomes deposited solely on (or solely in the vicinity of) the ionomer component of the ionomer-modified structural component. No catalyst is deposited on portions of (or materials of) the structural component that are not within the catalyst region comprising the ionomer component. In particular disclosed embodiments, the methods provide the ability to make ionomer-modified diffusion layers wherein the catalyst is deposited only on the ionomer component and not on the diffusion layer or any component of the diffusion layer, such as the base layer, the microporous layer, the treatment material, or the conductive material that is outside of the catalyst region comprising the ionomer. Thus, the disclosed methods circumvent the need to utilize expensive or complex fabrication methods to form catalyst layers that maximize the amount of catalyst needed to achieve/exhibit ionic accessibility and ionic connectivity with other electrochemical components, and electronic conductivity (which can be provided by conductive components within or near the catalyst region and/or the intrinsic conductivity of the catalyst itself). In some embodiments, the methods disclosed herein provide the ability to introduce the catalyst of the catalyst layer (that is the layer formed by the ionomer and selectively deposited catalyst) after the pore configuration of the electrode has been prepared, thus ensuring good reactant access (as compared to conventional electrodes wherein the catalyst is added before the catalyst layer structure is fully formed, thus losing any ability to control the final disposition and accessibility of the catalyst). As such, electrochemical components, such as the diffusion layer, can be fabricated and coupled with the ionomer component in a desired configuration prior to catalyst deposition. Thus, in some embodiments, a diffusion layer can be fabricated to have a desired pore size and/or pore configuration and it can be modified with the ionomer component. Subsequently, the catalyst can be selectively deposited V. Devices The disclosed ionomer components comprising a selectively deposited catalyst can be used in electrodes used for fuel cells or membrane electrode assemblies of fuel cells. For example, electrodes comprising ionomer components with selectively deposited catalysts can be used in polymer electrolyte fuel cells, direct methanol fuel cells or other direct-fuel fuel cells. In some embodiments, the ionomer components comprising a selectively deposited catalyst can be used to make nano-structured supports, such as nano-structured thin-film electrodes. In additional embodiments, the ionomer components comprising a selectively deposited catalyst can be used to make water electrolyzers, sensors, and/or electrochemical reactors, as well as non-electrochemical heterogeneous catalyst systems whereupon the structure underlying the catalyst participates in the relevant reactions by providing local ionic transport without the need or use of external electrical connections. In non-electrochemical devices, any high surface areas that are needed, but difficult to achieve with the ionomer component alone, can be readily achieved by coating or intermixing the ionomer with a high surface area component.

VI. Examples

Example 1

In this example, a coating of NAFION ionomer solution was jet dispensed onto the microporous surface side of an SGL 29BC commercial GDL. Upon drying, an ionomer spiral was impregnated 10 microns into the microporous layer of the GDL, the side which normally faces the ionomeric membrane in a fuel cell. Next, the spiral coated GDL was placed in a PTFE-lined chemical vapor deposition cell with platinum acetylacetonate (Pt(acac)$_2$). The Pt(acac)$_2$ was positioned above and directly adjacent to (or below and directly adjacent to) the uncoated surface of the GDL (that is, the surface that does not comprise the ionomer component), wherein "directly adjacent to" means that the catalyst precursor faces the uncoated surface of the GDL and there is not an intervening substrate or layer between the catalyst precursor (which can be held in a container or can be provided as catalyst precursor substrate wherein a substrate, such as a wafer, a plate, a film, a porous layer, etc., is coated with the catalyst precursor). The chamber was purged with humidified nitrogen to remove oxygen and to maintain the water content of the ionomer such that it is moderately well hydrated for the subsequent CVD process. The chamber was sealed and heated to 140° C. for 20 hours to vaporize and reduce the Pt(acac)$_2$. After the deposition process, a complete transfer and reduction of the Pt to the GDL occurred with no deposition on the PTFE chamber walls. While the deposition was not visible to the naked eye, X-ray fluorescence (XRF) imaging demonstrated that the vast majority of the platinum deposited in the area traced by the ionomer spiral and not on other components of the electrode (see FIGS. 6A-6C). Cross sectional SEM images indicated that the highly dispersed platinum was located within the impregnated layer of the ionomer spiral. Consequently, this example illustrates that the platinum catalyst preferentially deposits on (or in the immediate vicinity of) the ionomer in preference to the carbon fibers and PTFE of the GDL nonwoven base layer as well as the carbon black and PTFE of the GDL microporous layer. Without being limited to a particular theory, it is currently believed that once in a fuel cell all of the deposited Pt would be gas accessible to the reactants that would travel the same pathway to reach the catalyst in view of the observation that the Pt(acac)$_2$ vapor had to travel through the thickness of the GDL to get to the ionomer on the other side in the microporous layer. FIGS. 17A-17C and 18 (trace 1800) illustrate results obtained from this example (with respect to FIG. 18, trace 1802 was obtained from a deposition performed in a similar manner to Example 1, but with about 5× more Pt(acac)$_2$ precursor).

Example 2

This example demonstrates catalyst deposition can occur on certain ionomer components in preference over others. For example, a sodium-form NAFION exchange membrane and a proton-form NAFION exchange membrane were simultaneously exposed to Pt(acac)$_2$ using a CVD chamber as described above for Example 1. As can be seen by FIGS. 19A (showing the back surfaces of the membranes) and 19B (showing the front surfaces of the membranes), platinum produced from the Pt(acac)$_2$ deposited on the proton-form NAFION ionomer membrane, but did not deposit a significant amount on the Na+NAFION ionomer membrane. Without being limited to a particular theory, it is currently believed that this example illustrates that the acidity of the proton-form membrane help to promote selective deposition of the catalyst. It also is currently believed that selective deposition also may be assisted by the Pt(acac)$_2$ catalyst precursor having a higher sticking coefficient on the ionomer and/or the ionomer itself facilitating the reduction of the Pt(acac)$_2$ catalyst precursor.

Example 3

A 50 cm$^2$ region of the MPL side of a 3"×3" commercial SGL 29BC gas diffusion layer (GDL) was coated with Aquivion 830 aqueous ionomer solution to provide a dried ionomer loading of 0.5 mg/cm$^2$. Pt (from Pt(acac)$_2$) was deposited from the paper side of the GDL per this disclosure to achieve a final Pt loading of 0.1 mg Pt/cm$^2$. The now gas diffusion electrode (GDE) was tested as the cathode (air side) in a fuel cell using conventional single-cell hardware, a NAFION 211 membrane, and a conventional GDE for the anode. The fuel cell was first tested with the MEA assembled in the cell (the individual parts were not first laminated together). After a break-in period, the "assembled" polarization curve (illustrated with diamonds in FIG. 20) was obtained at a cell temperature of 80° C. using fully humidified reactants (100% RH) at 150 kPa. Reactant flow-rates were 1.2× stoichiometric for hydrogen and 2.0× for air. Performance appeared to be affected by poor interfacial connectivity between the electrodes and membrane; consequently, the MEA was removed and hot pressed then re-inserted into the cell. Subsequent performance under the same conditions was improved (illustrated as the curve with square data points in FIG. 20). The electrochemical surface area (ECSA) was determined using cyclic voltammetry. A very low 7 m$^2$/g of Pt was obtained, about $\frac{1}{10}$ that expected considering the 2-3 nm Pt particle size, indicating that the majority of catalyst was inactive, most likely stranded in the ionomer as shown in the micrographs. On the other hand, performance is quite good considering the low amount of active catalyst, indicating that the catalyst that was able to contribute is highly active and efficiently positioned. Results are illustrated in FIG. 20.

Example 4

Figure 21:
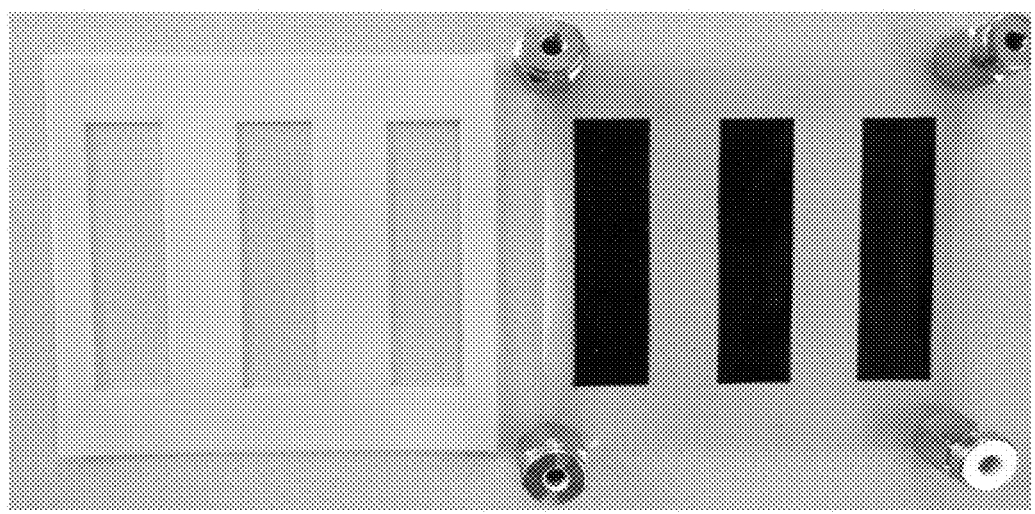
FIG. 21 is a photographic image of three Pt electrodes deposited using CVD onto a membrane (right) using an average Pt loading about 0.75 mg/cm$^2$ and the PTFE mask used to prevent deposition on the non-electrode regions of the membrane (left).

In this example, a series of CVD examples were performed directly onto polymer electrolyte membranes (no GDL, carbon black, or PTFE) using PTFE masks to define three 0.5"×2" electrodes uniformly spaced on a 3"×3" membrane to evaluate the ability to obtain lower penetration depth and higher surface concentration and connectivity. Preferential deposition was carried out using a PTFE mask to mask off areas of the membrane where deposition is unwanted. FIG. 21 shows a 3"×3" DuPont membrane XL catalyzed with the three 0.5"×2" electrodes to the right of the PTFE mask used to limit the deposition onto the membrane to the electrode areas. Since this electrode configuration results in large ½" gaps between the deposition zones, precursor material loaded into the PTFE filter above the mask regions was being left behind in the first trials as it was apparently too far and tortuous to diffuse to the electrode regions. Consequently, the precursors were subsequently impregnated into three strips of PTFE filter material the same size as the electrodes so that the diffusion pathway was minimal and direct. A "frame" of the PTFE filter material was then used to position the strips exactly above the unmasked electrode areas, as well as compress and hold the mask against the membrane. In some examples, a serpentine channel flow-field behind the PTFE filter material was used to decrease pressure drop and allow a more uniform flow and distribution of water vapor through the cell.

Figure 22:
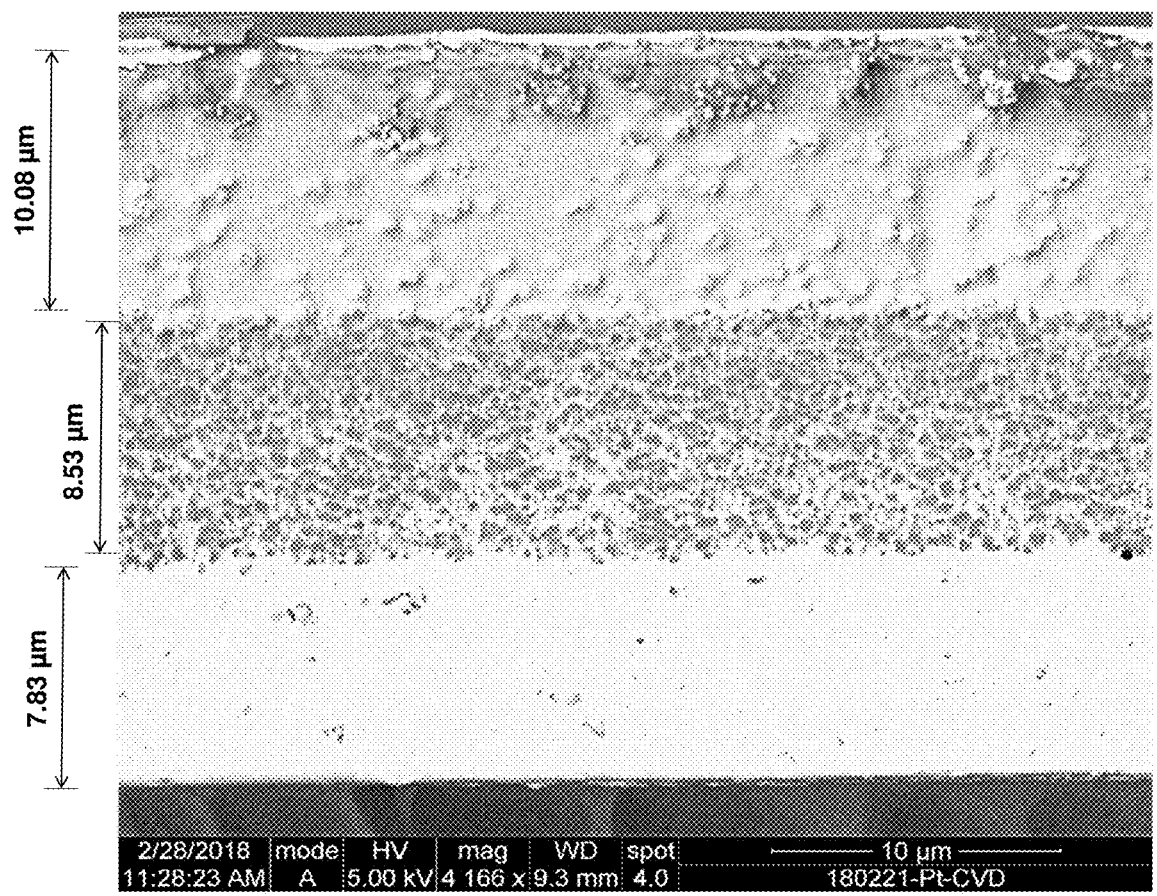
FIG. 22 is an SEM back-scatter image of a cross-section of a membrane wherein Pt is applied using CVD at high pressure (51 psi/3.48 atm).

In some embodiments, water vapor and flow-through were used because with some embodiments using higher loadings, it was determined beneficial to humidify and purge the CVD chamber. In such embodiments, water (vapor) introduction was achieved by using a syringe pump external to the convection oven supplying water through a capillary to the cell purge inlet on the deposition chamber in the oven, typically at a modest 0.1 ml/h, ideally enough to remove byproducts but not so much as to impact the CVD distribution. Flow out of the chamber is also through a capillary to avoid the back-flow of air if an open-ended outlet is used. Alternatively, a back-pressure regulating scheme can be used for performing depositions at above ambient pressures. If there is ever any desire to have the catalyst deposit throughout the full thickness of an ionomer-modified component, then this can be achieved by using elevated chamber pressures (e.g., pressures near the water vapor pressure) to increase the water activity. As shown by FIG. 22, using a pressure near the water vapor pressure, deposition of Pt occurred throughout the full thickness of an ionomer-modified membrane.

Figure 23:
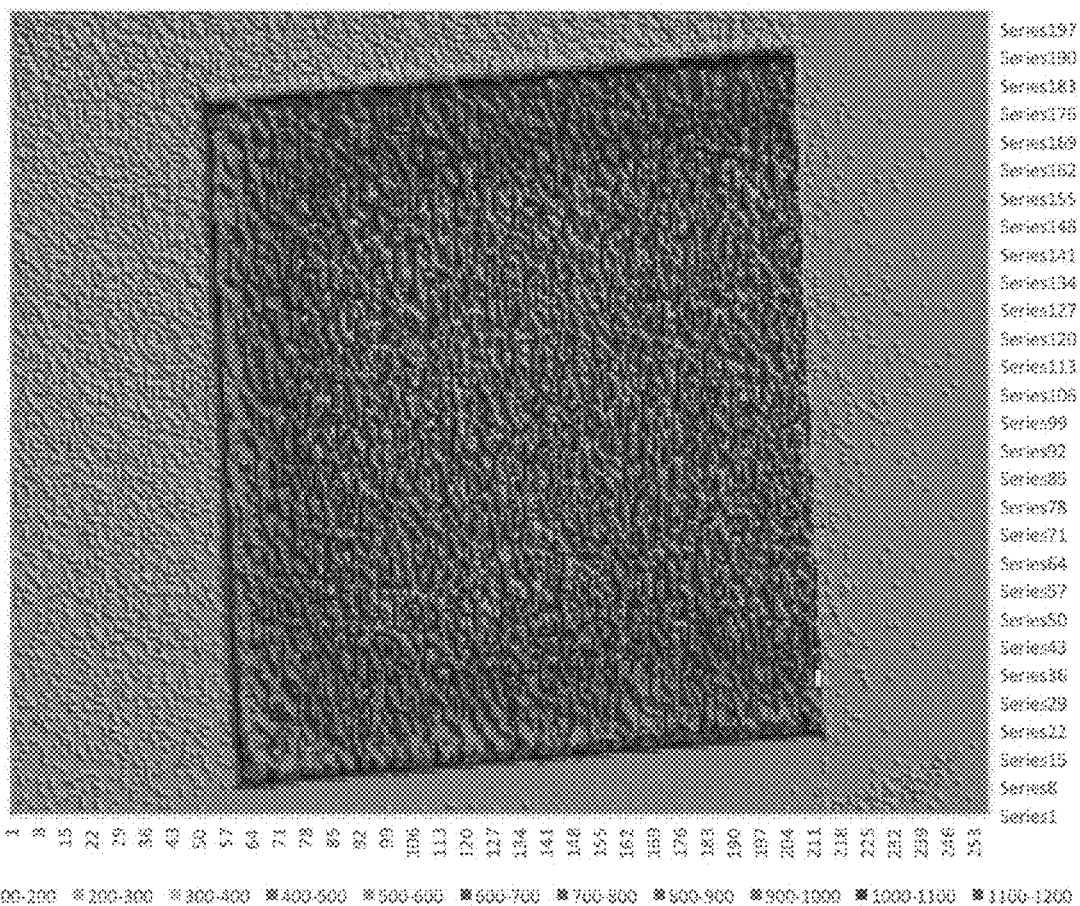
FIG. 23 is an XRF image of the surface of an electrode as shown in FIG. 21, which shows the significantly heavier deposition of Pt at the periphery near the mask (top, bottom, and left sides; electrode cut to ~0.5" on right side).

CVD conditions used to obtain the electrode embodiment shown by FIG. 23 included a temperature of 140° C., a time period of 16 hours, water injection at 0.1 ml/h, and a pressure of 0.76 atm. Loading averaged about 0.75 mgPt/cm². The periphery of the electrode surfaces were silvered and there was some surface conductivity even in the middle, but clearly the deposition was heavier around the periphery as shown in the scanning XRF of the Pt L line immediately below in FIG. 23. With reference to FIG. 23, one can see that the edge areas (dark blue, dark yellow, grey) have significantly more Pt than the center region (green, medium blue).

Example 5

In this example, different embodiments for depositing iridium for a water electrolyzer electrode were evaluated. In each example, the following deposition conditions were used: temperature was 140° C.; time was 16 hours; water injection was at 0.1 ml/h; and pressure was held at 0.76 atm. In a first example, $Ir(acac)_3$ was used as the iridium precursor. In a second example, Ir(acac)(cod) was used as the iridium precursor. In a third example, 5% (metal weight) of Pt(acac) was co-deposited with Ir(acac)(cod). In a fourth example, 5% Pt(acac) was co-deposited with $Ir(acac)(CO)_2$. The third and fourth examples resulted in high yields with uniform and dark deposition; lowering the CVD temperature could help improve the yields and selective deposition.

VII. Overview of Several Embodiments

Disclosed herein are embodiments a product, such as an electrochemical component, comprising an ionomer component that is modified with a selectively deposited catalyst. In some embodiment, the electrochemical component further comprises a structural component upon which the ionomer component is positioned, wherein the selectively deposited catalyst does not physically contact or is not located in areas of the structural component that do not also physically contact the ionomer component.

In any or all of the above embodiments, the structural component is a membrane, a gas diffusion layer, a template film, or a conductive support material.

In any or all of the above embodiments, the ionomer component is an ionomer membrane further comprising a permeation barrier positioned proximal to the catalyst region.

In any or all of the above embodiments, the electrochemical component is a catalyst material deposited within a catalyst region of a microporous layer of a diffusion component, wherein (i) the microporous layer comprises a conductive material, a treatment material, or a combination thereof and has a membrane-facing surface and a base layer-facing surface; (ii) the diffusion component further comprises a base layer comprising a microporous layer-facing surface and a gas reactant-facing surface; (iii) the microporous layer is deposited on the base layer such that the base layer-facing surface of the microporous layer faces the microporous layer-facing surface of the base layer; and (iv) the selectively deposited catalyst is selectively deposited such that it deposits on or proximal to the ionomer component within the catalyst region of the microporous layer and does not deposit in an area outside of the catalyst region of the microporous layer or on the base layer.

In some embodiments, the catalyst region of the microporous layer comprises the area at and/or below the membrane-facing surface of the microporous layer and extends into the microporous layer at distances ranging from 0.1 μm to 20 μm from the membrane-facing surface of the microporous layer.

In any or all of the above embodiments, the catalyst is located at an interface formed between the ionomer and a gas reactant access area of microporous layer and is not located at an interface formed between the ionomer and the conductive material of the microporous layer.

In any or all of the above embodiments, the catalyst is selectively deposited such that it is gas reactant accessible.

In any or all of the above embodiments, the catalyst is selectively deposited such that it is ionically connected to the ionomer component.

In any or all of the above embodiments, the catalyst is platinum or an alloy thereof.

In any or all of the above embodiments, the base layer comprises a conductive material that is not in physical or molecular contact with the catalyst.

In any or all of the above embodiments, the catalyst is not located at the interface formed between the microporous layer-facing surface of the base layer and the base layer-facing surface of the microporous layer.

In yet additional embodiments, products are disclosed that comprise an ionomer component comprising a selectively deposited catalyst; and a structural component upon which the ionomer component is deposited, wherein the selectively deposited catalyst does not physically contact or is not located in areas of the structural component that do not also physically contact the ionomer.

Also disclosed herein are embodiments of a method, comprising dispensing an ionomer solution onto one surface of a structural component to form an ionomer-modified structural component; exposing the ionomer-modified structural component to a catalyst precursor in a chemical deposition chamber comprising an internal chamber surface that comprises a low surface energy material and/or a surface modifier coating, wherein the catalyst precursor is positioned proximal to the ionomer-modified structural component; heating the chemical deposition chamber such that the temperature inside the chemical deposition chamber is maintained at an internal temperature sufficient to vaporize the catalyst precursor; and allowing the internal temperature inside the chemical deposition chamber to cool.

In some embodiments, ionomer solution is a perfluorosulfonic acid polymer solution.

In any or all of the above embodiments, the catalyst precursor is a platinum precursor, a palladium precursor, a ruthenium precursor, an iridium precursor, platinum alloy precursor, a palladium alloy precursor, a ruthenium alloy precursor, an iridium alloy precursor, and/or a combination thereof.

In any or all of the above embodiments, the catalyst precursor is $Pt(acac)_2$.

In any or all of the above embodiments, the structural component is a gas diffusion component comprising a microporous layer and a base layer.

In any or all of the above embodiments, the method can further comprise drying the ionomer solution after it has been dispensed onto the surface of the structural component.

In any or all of the above embodiments, the method can further comprise masking the ionomer-modified structural component with a mask material that covers the ionomer-modified structural component in regions such that the catalyst precursor is not able to access the regions.

In any or all of the above embodiments, the method can further comprise introducing a humidified inert gas into the chemical deposition chamber before heating takes place.

In any or all of the above embodiments, the catalyst precursor is deposited onto a surface of a substrate to provide a surface-coated substrate comprising a catalyst precursor layer, wherein surface of the substrate comprising the catalyst precursor layer has a surface area matching that of, or that is similar to, the ionomer-modified structural component.

In any or all of the above embodiments, the method can further comprise exposing the catalyst precursor, the ionomer-modified structural component, the ionomer solution, or a combination thereof to an oxidant.

Also disclosed herein are embodiments of a system for selectively depositing a catalyst onto an ionomer, comprising a surface-modified deposition chamber, wherein the chamber comprises an internal chamber surface that is coated with a surface modifier. In some embodiments, the surface modifier is PTFE.

Devices also are disclosed herein, such as device comprising two products according to any or all of the above embodiments, a membrane comprising a cathode-facing surface and an anode-facing surface, an anode, a cathode.

In any or all of the above embodiments, the first product is positioned between the anode-facing surface of the membrane and the anode and the second product is positioned between the cathode-facing surface of the membrane and the cathode.

Also disclosed herein are methods for using the devices disclosed herein and as disclosed above. In any or all of the above embodiments, the method comprises exposing the device to reactant produced from a fuel source, such as a hydrogen source, and from an oxygen source and isolating products, such as product liquids and/or gases, from the device. In any or all of the above embodiments, the method comprises placing the device in water, wherein the water comprises an electrolyte; and isolating product gases from the device.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. I therefore claim as my invention all that comes within the scope and spirit of these claims.

I claim:

1. A method, comprising:
   providing an electrode comprising a gas diffusion layer, wherein the gas diffusion layer comprises (i) a microporous layer having an ionomer component embedded thereon and/or therein, and (ii) a base layer that does not comprise the ionomer component;
   providing a catalyst precursor;
   positioning the electrode adjacent to the catalyst precursor such that the catalyst precursor is positioned directly adjacent to the base layer of the gas diffusion layer such that the base layer is positioned between the catalyst precursor and the microporous layer;
   heating the electrode and the catalyst precursor at a temperature sufficient to vaporize the catalyst precursor thereby providing a vaporized catalyst precursor; and
   depositing a catalyst formed from the vaporized catalyst precursor on the ionomer component of the microporous layer of the gas diffusion layer of the electrode, wherein the catalyst is not deposited on the base layer.

2. The method of claim 1, wherein the ionomer component is patterned onto or into the microporous layer.

3. The method of claim 1, wherein the electrode comprises a low surface energy material in the microporous layer and wherein the catalyst is not deposited on the low surface energy material.

4. The method of claim 3, wherein the low surface energy material is a conductive material selected from carbon fibers, carbon nanostructures, and/or carbon catalyst materials.

5. The method of claim 1, wherein the catalyst precursor is positioned adjacent to the base layer of the gas diffusion layer but does not contact the base layer prior to heating and any vaporization of the catalyst precursor.

6. The method of claim 1, wherein the temperature ranges from 110° C. to 300° C.

7. The method of claim 1, further comprising exposing the catalyst precursor, the ionomer component, the gas diffusion layer, or any combination thereof to an active agent, an acid, or a combination thereof.

* * * * *